United States Patent [19]

Cardwell, Jr.

[11] Patent Number: 4,638,344
[45] Date of Patent: Jan. 20, 1987

[54] JUNCTION FIELD-EFFECT TRANSISTOR CONTROLLED BY MERGED DEPLETION REGIONS

[76] Inventor: Walter T. Cardwell, Jr., 217 Bedford Forrest Ave., Anderson, S.C. 29621

[21] Appl. No.: 368,839
[22] Filed: Apr. 15, 1982

Related U.S. Application Data

[63] Continuation-in-part of Ser. No. 83,092, Oct. 9, 1979.
[51] Int. Cl.⁴ .................. H01L 29/80; H01L 27/04
[52] U.S. Cl. .......................... 357/22; 357/20; 357/41
[58] Field of Search ............ 357/22, 20, 41, 13, 357/89, 90

[56] References Cited

U.S. PATENT DOCUMENTS

| | | | |
|---|---|---|---|
| 3,223,904 | 12/1965 | Warner, Jr. et al. | 357/22 |
| 3,264,492 | 8/1966 | Gault | 357/22 |
| 3,271,587 | 9/1966 | Schreiner | 357/38 |
| 3,335,342 | 8/1967 | Leistiko et al. | 357/22 |
| 3,360,698 | 12/1967 | Warner, Jr. et al. | 357/13 |
| 3,398,337 | 8/1968 | So | 357/22 |
| 3,404,295 | 10/1968 | Warner, Jr. | 357/34 |
| 3,414,782 | 12/1968 | Lin et al. | 357/22 |
| 3,472,710 | 10/1969 | Welty | 357/22 |
| 3,506,888 | 4/1970 | Siebertz et al. | 357/14 |
| 3,533,159 | 10/1970 | Hudson, Jr. | 357/22 |
| 3,538,399 | 11/1970 | Bresee et al. | 357/22 |
| 3,564,356 | 2/1971 | Wilson | 357/34 |
| 3,591,840 | 7/1971 | Glinski | 357/22 |
| 3,594,241 | 7/1971 | Bresee | 357/43 |
| 3,701,198 | 10/1972 | Glinski | 357/22 |
| 3,704,399 | 11/1972 | Glaise | 357/13 |
| 3,764,864 | 10/1973 | Okumura et al. | 357/13 |
| 3,794,891 | 2/1974 | Takamiya | 357/14 |
| 3,808,515 | 4/1974 | Davis et al. | 357/14 |
| 3,821,776 | 6/1974 | Hayashi et al. | 357/22 |
| 3,893,147 | 7/1975 | Williams et al. | 357/22 |
| 3,999,207 | 12/1976 | Arai | 357/22 |
| 4,064,525 | 12/1977 | Kano et al. | 357/22 |
| 4,175,240 | 11/1979 | Kremlev et al. | 357/22 |

OTHER PUBLICATIONS

Warner et al, Solid State Electronics; vol. 18, pp. 323-325, Apr. 1975.
B. L. Grung, PhD Thesis, "Investigation of Lock-Layer . . . ", U. of Minn., 1976.
Hamilton & Howard, Basic IC Engineering (McGraw-Hill, NY, 1975), p. 24.

Primary Examiner—William D. Larkins
Attorney, Agent, or Firm—Dorsey & Whitney

[57] ABSTRACT

A new method of semiconductor operation has been conceived, developed and applied to produce a revolutionary new semiconductor design. The method is that of merging depletion regions for purposes of operation, isolation and control of channel current in a junction field-effect transistor. Using this method depletion regions are made to merge with suitable biasing in an intervening layer interposed between the gate and channel of a junction field-effect device and the interaction of the depletion regions is used for isolation and coupling to alter the associated depletion region in the channel of the junction field-effect device.

A number of embodiments are disclosed of the new junction field-effect transistor controlled by merged depletion regions. In each embodiment a channel of one conductivity type material is formed in a semiconductor body of opposite type material. A gate region of the same conductivity type material as the channel is placed near enough to the channel so that when the gate junction is reversed bias, the gate depletion region merges with the channel junction depletion region in the intervening layer. When the two depletion regions have merged, the gate controls the channel current in a manner similar to conventional devices.

Because the output and input and control connections are of the same conductivity type material, no metal contacts or interconnections are required. The lack of need for metal interconnects makes the device better suited to integrated circuits than any other device. In addition, the depletion regions surrounding the gate and channel isolate the gate and channel from other semiconductor regions of the same conductivity type and thus isolation regions are not required for the junction field-effect transistor controlled by mergers depletion regions. Consequently, use of the invention can result in the densest form of logic available today. Such devices hold the promise of improved performance in almost every semiconductor device application and can be used in almost every application where MOS and junction field-effect devices are now used.

52 Claims, 70 Drawing Figures

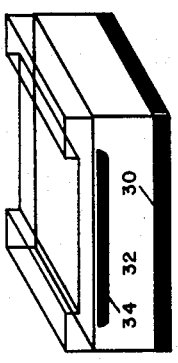 Fig. 11a 1 St. Oxide
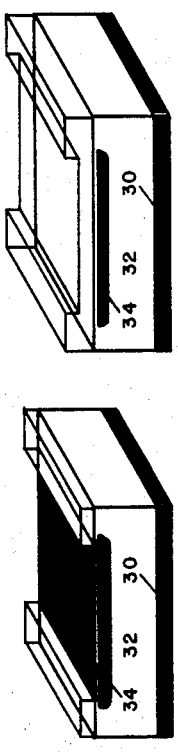 Fig. 11b Etch
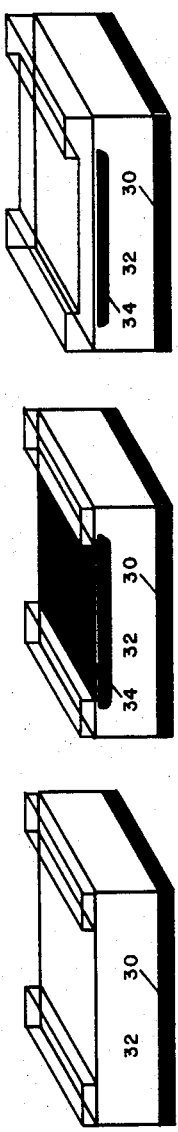 Fig. 11c N Diffusion
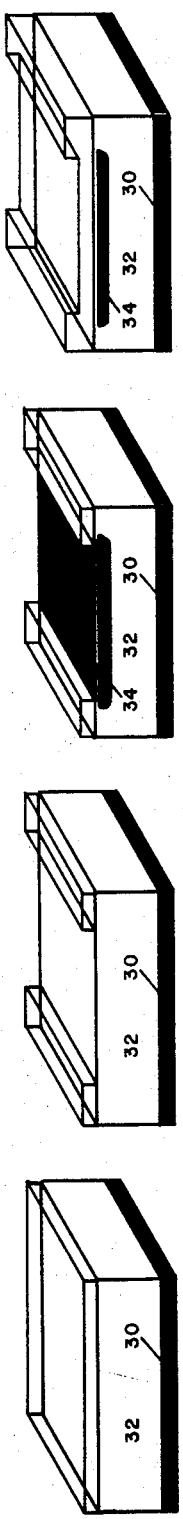 Fig. 11d 2nd. Oxide
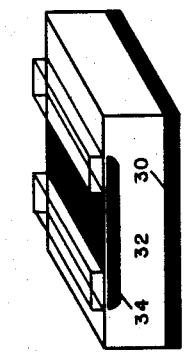 Fig. 11e Etch
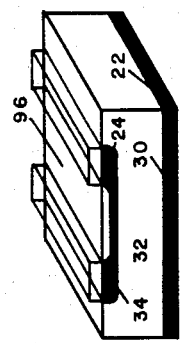 Fig. 11f P Diffusion
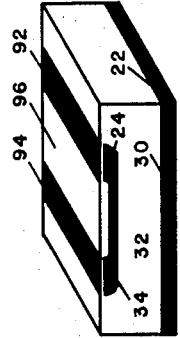 Fig. 11g Etch

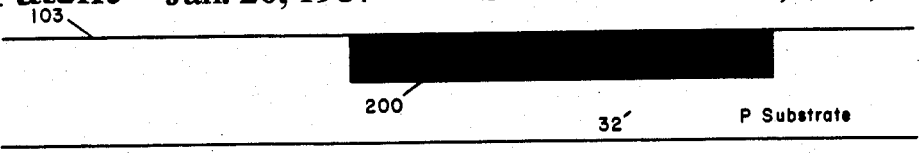
Fig. 13a
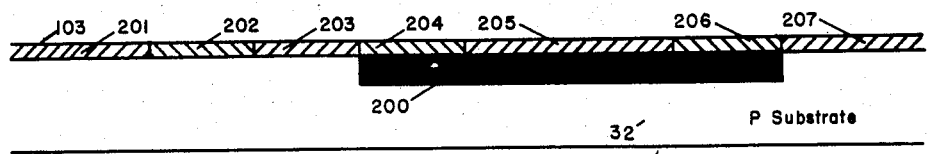
Fig. 13b
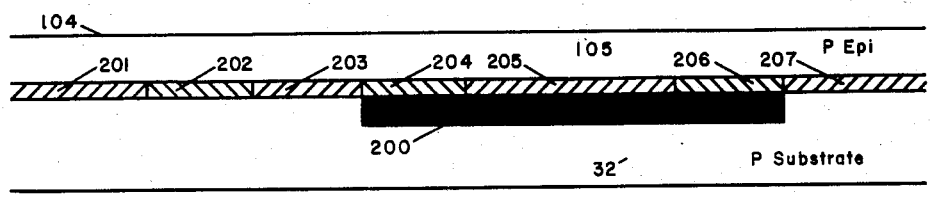
Fig. 13c
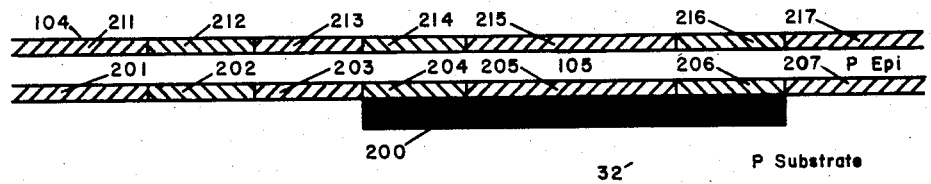
Fig. 13d
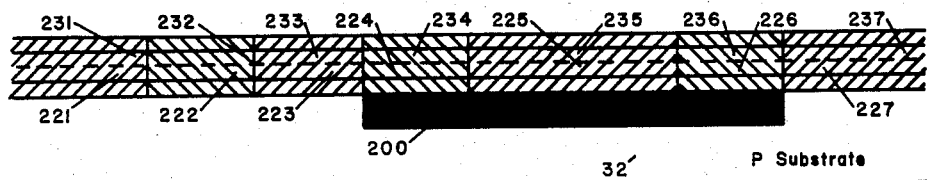
Fig. 13e
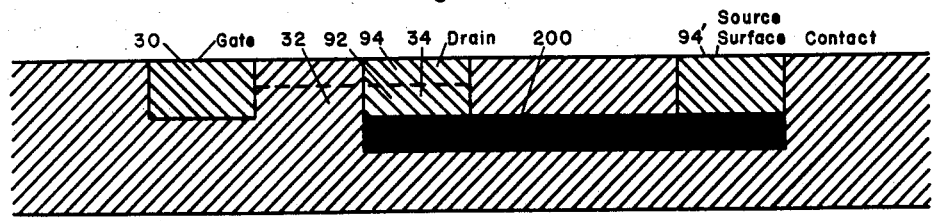
Fig. 13f
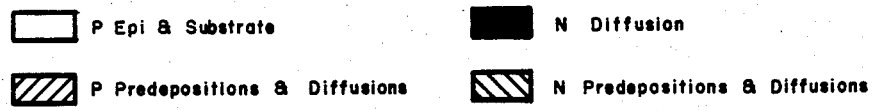

Linear  Vt = .5V  D= 1.11H              Linear  Vt = 0  D=H $V_{gs} = V_t$ $V_{gs} = .2V_p$ $V_{gs} = V_p$ $V_{max} = 3.93V_p$ $V_{max} = 3V_p$ Quadratic    $V_f = 0$    $D = 1.2H$ Quadratic    $V_f = 0$    $D = .69H$

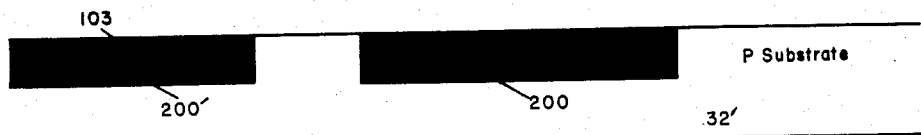
Fig. 16a
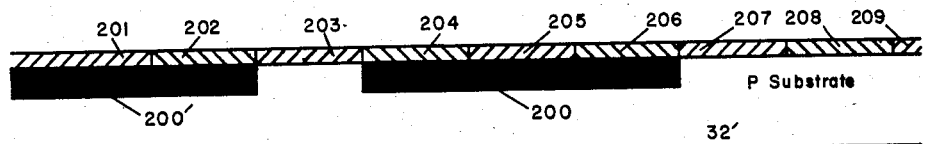
Fig. 16b
Fig. 16c
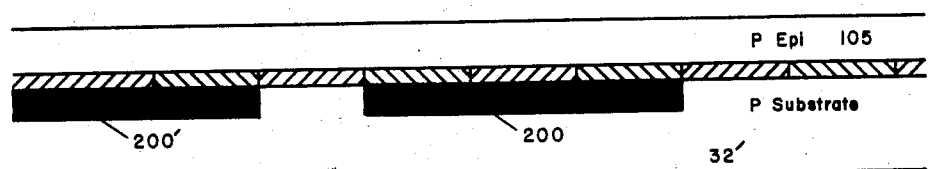
Fig. 16d
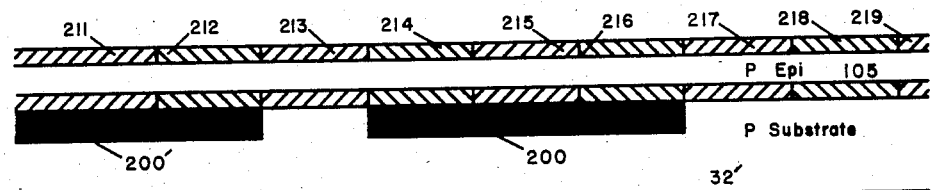
Fig. 16e
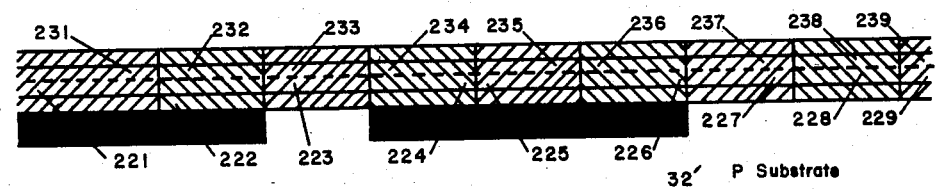
Fig. 16f
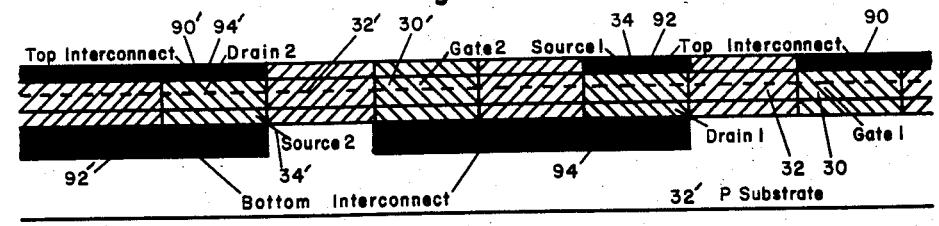

JUNCTION FIELD-EFFECT TRANSISTOR CONTROLLED BY MERGED DEPLETION REGIONS

RELATED APPLICATIONS

This application is a continuation-in-part of U.S. patent application Ser. No. 83,092, filed Oct. 9, 1979.

BACKGROUND OF THE INVENTION

The field of the invention is junction field-effect transistors and particularly junction field-effect transistors having a channel of the same conductivity type material as the source and drain electrodes.

A conventional junction field-effect transistor (JFET) comprises a source and drain electrode of a first conductivity type material interconnecting a channel of the same conductivity type material through which current flows. Contacting the channel and forming a junction therewith is one or more gate regions of a conductivity type material opposite to that of the channel. If used in an integrated circuit the JFET is normally mounted on a semiconductor substrate and the JFET is isolated from other devices with an isolation region, of semiconductor material of a conductivity type opposite to the gate, which surrounds the JFET.

Reverse biasing the gate and channel junctions causes depletion regions to form in the channel. Current flow through the channel is controlled through the use of these depletion regions which, when merged, pinch off current flow through the channel and, when unmerged, allow current to flow.

Since the source and drain electrodes are of a different conductivity type material than the gate electrode, metal interconnects must be used when interconnecting conventional JFET devices. In conventional devices gate electrodes must also be isolated from the substrate if they are to be useful in integrated circuits. In addition conventional construction has prevented enhancement mode junction field-effect transistors from being realized, that is, a device whose channel current is zero with the gate and source electrodes connected together.

The use of merged depletion regions has had limited uses in the prior art. When merged, the same potential has been applied across opposing junctions and used for isolation, to achieve variable capacitance and to control current in the channel of a junction field-effect transistor where the depletion regions pinch off current flow through the channel and thus control current through the channel. Until now, the merging of depletion regions other than in the channel of a JFET has been something that generally has been avoided due to the high currents that result when one of such regions inadvertently extends to the next junction and causes "punch through", that is, when one junction depletion region punches through to an adjoining junction with a resulting high current. Punch through, however, has been used intentionally for MOS input protection and as a noncritical voltage regulator.

Finally, Warner U.S. Pat. No. 3,404,295 uses a buried locklayer in a bipolar transistor, a region of conductivity type material of a type opposite to the collector buried in the collector, to prevent punch through of the emitter junction depletion region to the collector of the bipolar transistor. With a control voltage applied to the locklayer the collection of free carriers in the bipolar transistor can also be affected which affects the current flow through the bipolar device.

BRIEF SUMMARY OF THE INVENTION

The invention, a junction field-effect transistor controlled by merged depletion regions (MFET), is a new structure for junction field-effect transistors. Control of the channel depletion region in the channel is achieved by merging another depletion region with the channel depletion region outside of the channel. Rather than using a gate region or regions of a conductivity type opposite to that of the channel positioned immediately adjacent to the channel, thereby forming gate-channel junctions, the present invention uses one or more gate electrodes of the same conductivity type material as the channel.

The gate electrode is spaced from the channel and an intervening layer of semiconductor material of a conductivity type opposite to that of the source, drain, channel and gate is used between the gate electrode and the channel. Depletion regions associated with the channel junction and the gate junction are then created in the intervening layer with reverse bias applied to the respective junctions and caused to merge in the intervening semiconductor region.

Control of and changes to the depletion regions in the intervening layer is reflected in the channel. Thus, bias voltages and control voltages can be applied to create known circuit arrangements and some new circuit arrangements wherein the gate controls the channel current in a manner similar to conventional junction field-effect transistors. The construction of the device, however, enables it to be manufactured in integrated form without the use of any isolation regions.

The invention is better suited to integrated circuits than any other known devices because all connections are formed of the same conductivity type material. Therefore, no metal contacts, electrodes or interconnections are required to create integrated circuitry, which permits the construction of true three dimensional circuits. The lack of the need for metal interconnects and isolation regions makes the invention suitable to create denser forms of logic than are known today.

As a discrete device, the invention is characterized by lower noise and lower feedback capacitance than any other type of device and, with a submicrometer channel length obtained in a vertical structure, a cut-off frequency well above all other known transistor types is attained. Because the gate is separated from the channel, high voltage operation is possible while the self-ballasting nature of field-effect devices permits large-area high-current devices to be constructed. As in the integrated form, the separation of the gate and channel permits operation of the device in an enhancement mode and by changing the gate to channel spacing or the impurity concentrations, the threshold voltage can be changed.

Properly constructed, one embodiment of the device, referred to as a "linear device", has as low or lower distortion than any other device and should have no change in threshold voltage with temperature.

A second embodiment of the device, referred to as a "quadratic device", has lower threshold voltage variations with temperature than other devices while its distortion is comparable to other junction field-effect transistors.

In addition, both versions are as radiation resistant and as rugged as other junction field-effect devices.

BRIEF DESCRIPTION OF THE DRAWINGS

FIG. 5, comprising

FIG. 10 comprising

FIG. 11 comprising FIGS. 11a through 11g, show the manufacturing steps to make the MFET of FIGS. 1 and 10.

FIG. 12, comprising FIG. 12a is a top view of the FIG. 2 device; FIG. 12b is a sectional side view taken along the line b—b of FIG. 12a; and FIG. 12c is a sectional side view showing the gate contact being brought to the surface taken along line c—c in FIG. 12a. FIG. 12d is a elevational cross section of the MFET of FIG. 4.

FIG. 13, comprising FIGS. 13a through 13f, show manufacturing steps to make a vertical MFET such as shown in FIG. 3 with the source contact brought to the surface of the device.

FIG. 15, comprising FIG. 15b shows an elevational cross section of the device of FIG. 15a taken along the lines b—b of FIG. 15a and further shows how the depletion regions will form when utilizing the invention when there is a nonuniform diffusion profile.

FIG. 16, comprising FIGS. 16a through 16f, show manufacturing steps similar to those shown in FIG. 13 in which two vertical MFETs of the present invention are connected together with interconnects at the substrate level.

FIG. 17, comprising

FIG. 18, comprising

DESCRIPTION OF THE PREFERRED EMBODIMENT

Figure 1:
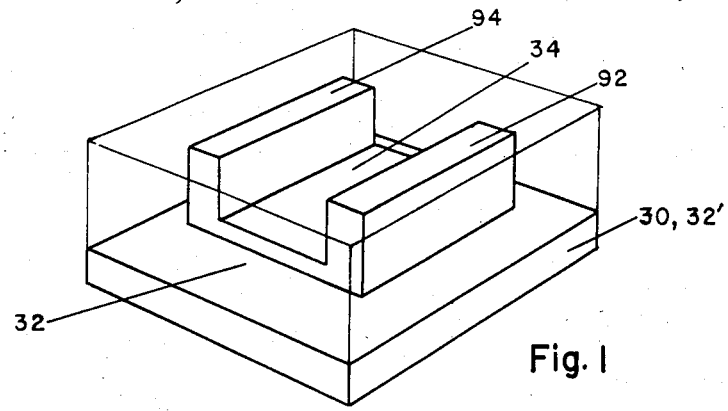
FIG. 1, is a pictorial of one embodiment of my invention referred to as a horizontal MFET wherein current flow through the channel is horizontal relative to the surface of the device. Since the gate spans the entire shown portion of the device this embodiment is suitable for discrete MFETs built according to my invention.

FIGS. 1 through 4 show various embodiments of the field-effect transistor controlled by merged depletion regions (MFET) 90 which is by invention. As shown in each of these figures, the invention is characterized by having a gate electrode 30 of a first conductivity type material which is separated from a channel 34 having source and drain electrodes, 92, 94, all formed of the same conductivity type material. The intervening layer of semiconductor material, 32, interposed between the gate 30 and channel, 34, is of the same semiconductor type material as the bulk material in which the gate 30 and channel 34 are embedded which is, in each embodiment except FIG. 1, the same conductivity type material as the substrate 32' upon which the semiconductor device is built. Therefore, the intervening layer 32 can generally be considered an extension of or a part of the substrate 32'. As is conventional in junction field-effect devices, either end of the channel 92 or 94 can be the source 92 or drain 94 electrode depending on the potential applied to that electrode 92 or 94.

The first embodiment of the invention 90 shown in FIG. 1 is referred to as a horizontal MFET. The method of constructing this embodiment is discussed in connection with FIGS. 10 and 11. The method of using depletion regions 36, 38, 40, 42 to operate it 90 is discussed in connection with FIG. 5. In this embodiment, the original substrate 32' of the chip can be used as the gate electrode 30. Assuming that the original substrate 32' is N type material, a P type epi layer 32 can be constructed and into the P type epi layer 32, channel 34, drain 94 and source 92 regions are defused. The operation of the device 90 is then controlled by merged depletion regions 38, 40 which merge in the P type epi layer 32 between the gate 30 and channel 34. Any changes in the potential applied to the gate 30 affects the depletion region 38 associated with the junction 22 between the gate 30 and the intervening layer 32. Since the gate depletion region 38 is merged with the channel depletion region 40 in the intervening layer 32, changes in the gate depletion region 38 also change the depletion region 40 associated with the channel junction 24 in the intervening region 32. These changes are mirrored in the channel depletion region 42 in the channel 34. Consequently, an extention of the gate depletion region 38 towards the channel 34 will cause the depletion region 42 in the channel 34 to withdraw and open the channel 34 to current flow. Conversely, withdrawal of the depletion region 38 associated with the gate 30 towards the gate 30 causes the depletion region 42 in the channel 34 to extend farther into the channel 34 sufficiently to pinch off current flow through the channel.

Consequently, current flow through the channel 34 is controlled by the potential applied to the gate 30 relative to the intervening layer 32.

Figure 2:
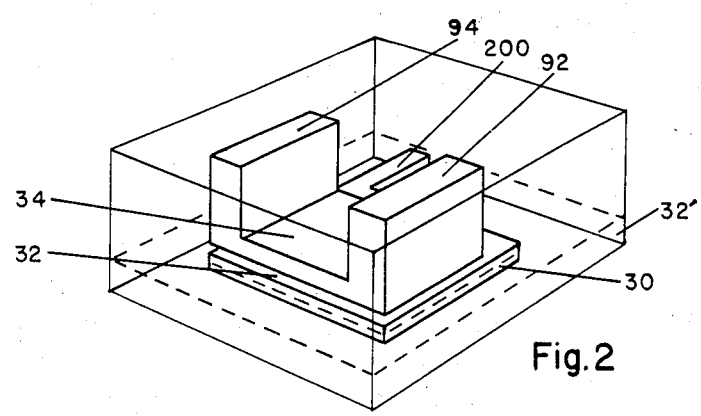
FIG. 2 is a second embodiment of a horizontal MFET where the gate electrode is positioned under the channel. The gate electrode may be brought to the surface as explained below, or may be interconnected at the semiconductor level of the gate.
Figure 3:
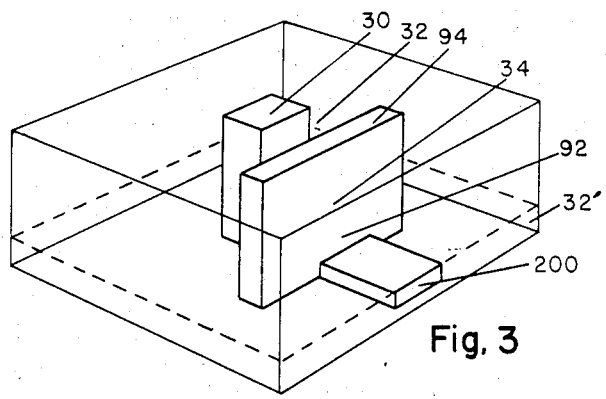
FIG. 3 is a third embodiment of my invention referred to as a vertical MFET. As shown, the gate and either the source or drain electrode is present on the surface of the device. The other channel electrode is shown interconnected at a substrate level.
Figure 4:
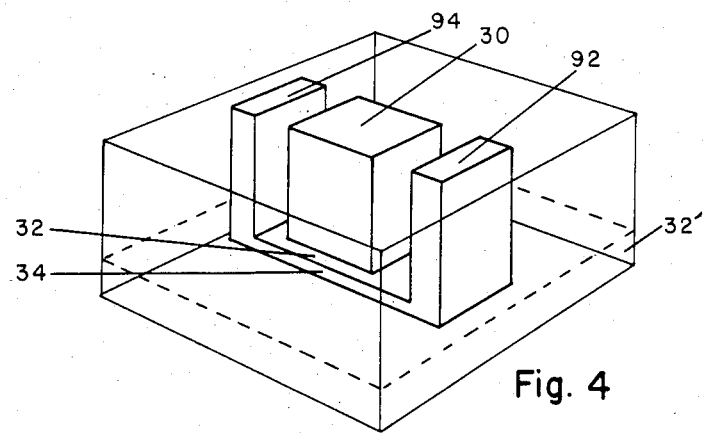
FIG. 4 is a fourth embodiment of a horizontal MFET wherein all electrodes, gate, source and drain, are present at the surface of the device.

The same principles of operation apply to the embodiments of my invention 90 shown in FIGS. 2, 3 and 4. The various embodiments 90 differ basically in the orientation of the gate 30 and the channel 34 relative to each other and to the surface of the device 90. As shown in FIG. 2, the gate region 30 is defused into the substrate 32' prior to building an epi layer 32 over the gate. A semiconductor contact 30' for the gate 30 can be brought to the surface as shown in FIG. 12 or the gate 30 can be interconnected 200 with semiconductor material 300 to another device 90' at the substrate level as shown in FIGS. 3 and 16. The depletion region 38 which forms around the gate 30 isolates the gate 30 from any other gates or other regions of the same conductivity type in an integrated circuit. Consequently, the FIG. 2 embodiment would be more suitable for integrated circuitry while the FIG. 1 embodiment is more suitable for discrete devices.

FIG. 3 shows a vertical MFET 90, referred to as vertical since current flow in the channel 34, relative to the surface of the device, is toward or away from the surface rather than parallel to it, as shown in connection with the embodiments of FIGS. 1, 2 and 4. In this device, which is a preferred embodiment and believed most appropriate for large scale integrated circuitry, surface contacts 30, 92, 94 can be achieved at the upper level of the device. In addition, semiconductor interconnects 200 can be achieved at the lower substrate 32' level of the device, such as shown in connection with FIGS. 3, 13 and 16, or at the surface 104, since all electrodes, gate 30, source 92 and drain 94 are formed of the same conductivity type material.

The FIG. 4 embodiment is also referred to as a horizontal device 90 since current flow in the channel 34 is horizontal relative to the surface of the device. It is similar to FIG. 2 except that the gate 30 is at the surface of the device 90 and the channel 34 is below the gate 30 but still separated by the intervening region 32. By constructing the device 90 in this manner all electrodes 30, 92, 94 are at the surface of the device 90 and it can be interconnected with semiconductor material of the same semiconductor type or can be interconnected in a conventional manner if desired.

The basic methods of operation, which includes the method of operating the semiconductor device 90 by merged depletion regions 38, 40 in the intervening layer 32 and the method of controlling current through the channel 34 of a junction field-effect device with the method of charge balance, have been fully and exhaustively explained in my co-pending application, Ser. No. 83,092, the disclosure from which is incorporated herein by reference. These basic methods of operation can be summarized as follows:

In my prior application, I fully diagramed and discussed the existence of the electrical fields 50, 52 (E Fields) and depletion regions 36, 38, 40, 42 of two adjacent P-N junctions 22, 24 beginning when the junctions 22, 24 were unbiased to the condition in which one depletion region 38 punches through to the opposing junction 24. It should be understood that the devices 90 of the invention are meant to operate when depletion regions 38, 40 associated with adjacent junctions 22, 24 have merged but before either depletion region 38 or 40 punches through to the opposing junction 24 or 22.

Referring to FIG. 5, the gate 30 and channel 34 are shown of an MFET 90. Although shown as one of the horizontal MFETs, it should be understood that this analysis is fully applicable to a vertical MFET as well.

Figure 5A:
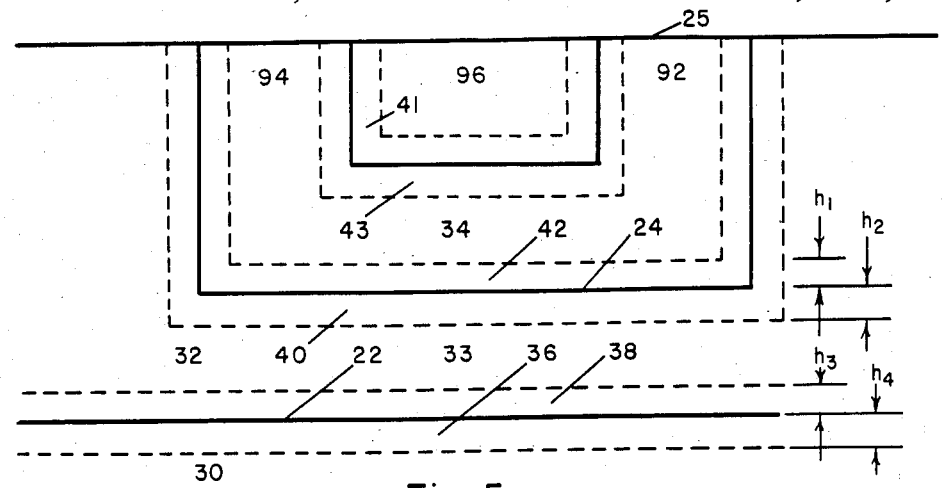
FIGS. 5a–5f is an elevational side view of the FIG. 1 embodiment, showing the interaction of E fields and depletion regions in a device constructed according to my invention.

FIG. 5a shows the two junctions 22, 24 before the application of any reverse bias. Depletion regions 36, 38, 40, 42 form because of contact potential and any bias applied to the junctions 22, 24. Prior to the merger of the depletion regions 38, 40, the P region 33 between the depletion regions 38, 40 is an extension of the rest of the P region 32 and, acting as a conductor, it must be at ground potential if the P type semiconductor material 32 is grounded.

Figure 5B:
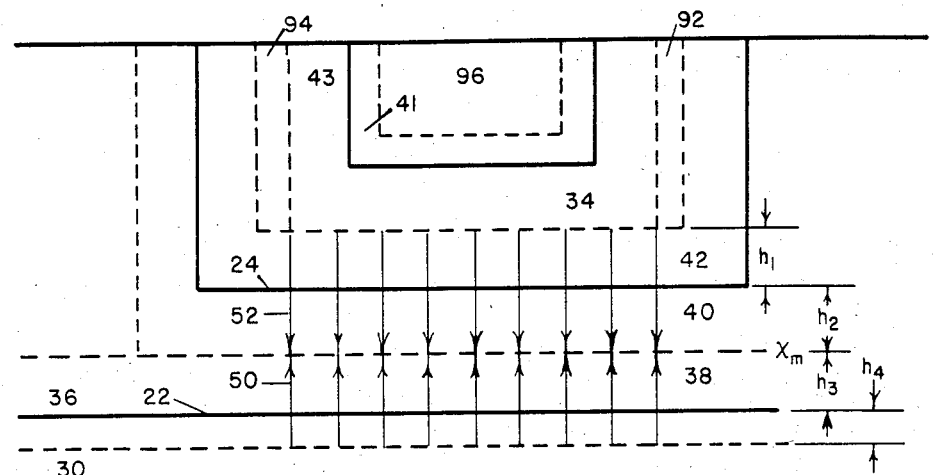

In FIG. 5b, a reverse bias has been applied to each of the junctions 22, 24 sufficient to cause the gate depletion region 38 in the intervening layer 32 to merge with the channel depletion region 40 in the intervening layer 32. As shown in FIG. 5b, both junctions 22, 24 are equally reverse biased. When the depletion regions 38, 40 merge, there is no longer a P region 33 between the depletion regions 38, 40 to form a conductor. This permits the potential $V_m$ at $X_m$ between the two depletion regions 38, 40 to rise above ground potential if necessary. If the two depletion regions 38, 40 have just merged, the point where they meet will still be at ground potential, even though there is no remaining undepleted area which is still part of the grounded P layer 32. This is due to the fact that integrating along the E Field 50, 52 results in a potential that is equal to the applied reverse bias voltages. If the reverse bias across either junction is increased, the potential $V_m$ where the two depletion regions 38, 40 merge, at $X_m$, is no longer at ground potential.

This indicates a fundamental property of the E Field 50, 52 when the two depletion regions 38, 40 are merged and allows the assignment of portions of the merged depletion region 38 and 40 to each junction 22, 24. The E Field 50, 52 between the two junctions 22, 24 reverses direction at some point between the junctions 22, 24 and at this point of reversal the E Field 50, 52 must be zero. This will be at the point, $X_m$, that separates the two depletion regions 38, 40 and at the same time will be the lowest potential along a line between the two junctions 22, 24. When the two depletion regions 38, 40 have just merged, the potential $V_m$ shown at $X_m$ will be at ground potential, even though there is no undepleted intervening layer 33 to conduct. If the reverse bias is increased beyond the point that the E Field 50, 52 between the two junctions 22, 24 can support, the potential $V_m$, where the two depletion regions 38, 40 merge at $X_m$, is no longer at ground potential. Since there is no further charge between the two junctions 22, 24 to support the increased potential of the increase in bias values, it appears as an increase in the potential $V_m$ at point $X_m$ where the two depletion regions 38, 40 merge.

When the bias applied to one junction 22 or 24 is increased, the point $X_m$ will move away from that junction 22 or 24 until the difference in potential between the other region 34 or 30 and $X_m$ is equal to the contact potential of an unbiased junction 24 or 22. Any further increase will cause punch through.

For any junction formed from materials with uniform doping the charge on one side of a junction must equal the charge on the other side of the junction. That this must be the case can be seen by understanding where the bound charge in the depletion regions comes from. Any semiconductor material doped to produce excess holes or electrons is still electrically neutral. The mobile charge carriers are balanced by bound charges of opposite polarity. When the two types of material are joined to form a junction, the excess carriers result in a concentration gradient which results in a diffusion current toward the junction. When two opposite type carriers meet, they annihilate each other which results in the depletion of mobile charge carriers in the depletion regions on each side of the junction. In these depletion regions there is left behind the bound charge of opposite polarity to that of the mobile carriers in the material. Since one hole combines with one electron, the fixed charges that remain on each side of the junction must be equal in magnitude but opposite in polarity. Thus, changes to the depletion region 40 on one side of a junction 24 are reflected or mirrored on the other side 42 of the junction 24.

Figure 5C:
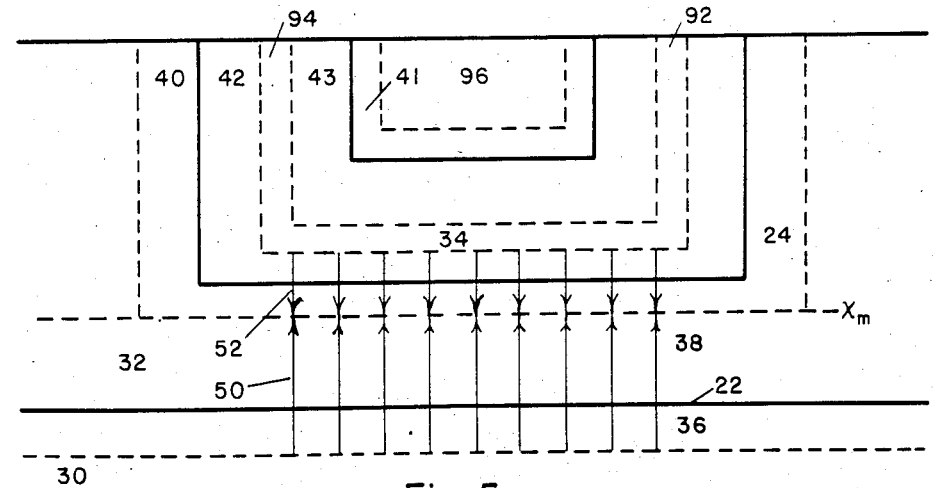
Figure 5D:
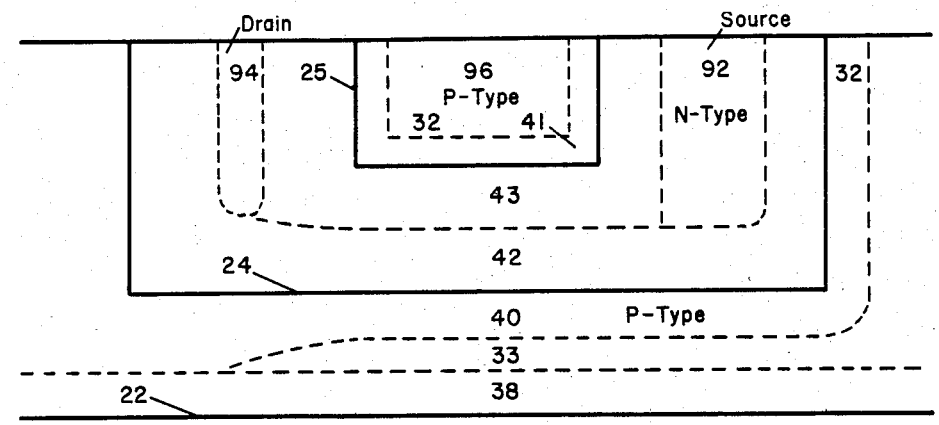

FIGS. 5d, e and f show the depletion regions of a semiconductor device 90 having an N-type channel 34 and gate 30 which employs the methods set forth above to control the P-side channel depletion region 40 of the channel junction 24 in the P-type intervening layer 32. The embodiment shown in FIG. 5 is one embodiment of the invention and is illustrated as shown for ease of discussion. However, in other applications, the device 90 can utilize a gate 30 or any combination of gates 30 separated from any side of the channel 34.

FIG. 5d shows the source 92, drain 94, channel 34, gate 30, and intervening layer 32, 96 of a field-effect device 90, with the associated depletion regions 36, 38, 40, 41, 42 and 43 indicated by the dotted lines. The drain 94 and source 92 are N-type material and joined by a channel 34 of the same N-type material and impurity concentration as the source 92 and drain 94. The concentration of the N region 34 is equal to that of the P region 32; thus, the depletion region 40, 42 will spread out an equal distance on each side of the channel junction 24. The gate 30 is a very heavily doped N region, placed close enough for the P depletion regions 38, 40 in the intervening layer 32 to merge.

In FIG. 5d the gate voltage Vg is equal to the source voltage Vs and the source voltage is high enough to pinch off the channel 34. The drain 94 is at a higher voltage so that, in this configuration, the device 90 is operating like a pinched-off JFET. With the low gate voltage, the gate depletion region 38 does not meet the channel depletion region 40 as is shown in FIG. 5c by the dotted lines.

Because the channel 34 is pinched off, the potential at the center of the channel 34 is the pinch-off voltage.

Figure 5E:
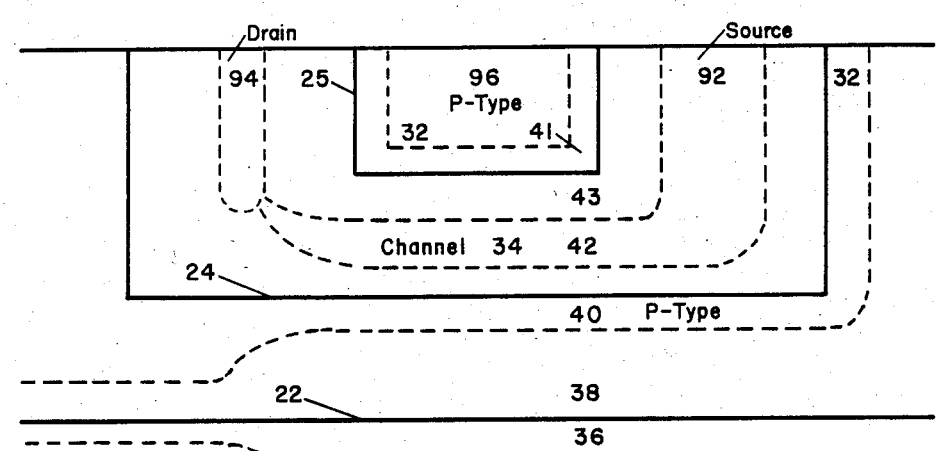

FIG. 5e has the same configuration as FIG. 5d except that the gate voltage Vg has been increased to equal the drain voltage Vd. At this higher potential, the depletion region 40 of the channel 34 in the P region 32 will now merge with the depletion region 38 of the gate 30. The dotted line in FIG. 5e in the P region 32, at the reference line, is the point Xm where the E Field is zero and assigns a portion of the depletion region 38, 40 to the gate 30 and channel 34.

The increase in potential of the gate 30, with respect to the P epi layer 32, has shifted the point of zero E Field in the P region 32 toward the channel 34. Due to overall charge balance, the depletion region 42 in the channel 34 must decrease and open up the channel 34. The gate 30 must be adjacent to the length of the entire channel 34, otherwise only a localized pocket of the channel 34 will open up and no current will flow. When the gate 30 opens the entire channel 34, the device 90 turns on and conducts. FIG. 5e shows the channel 34 pinched off at the drain end 94, as it will be; thus, the device operates in the saturation mode in a manner similar to a conventional junction field-effect transistor.

Figure 5F:
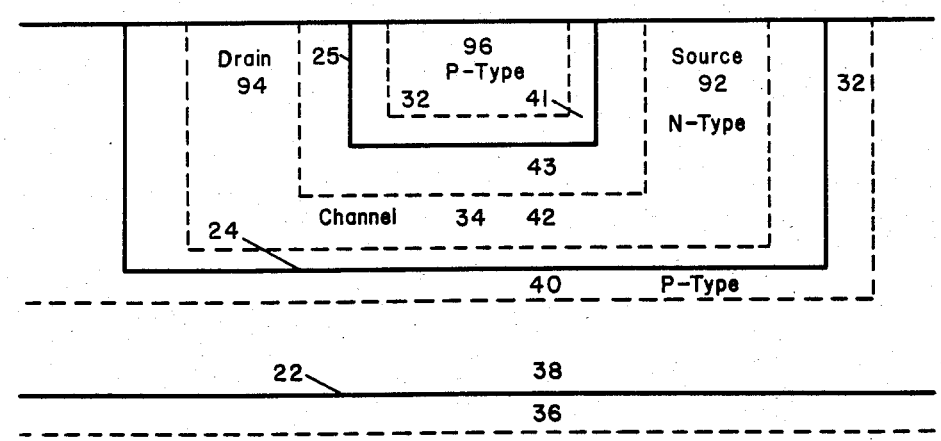

FIG. 5f shows what occurs when the drain voltage is lowered to the source voltage. At this point the entire channel 34 opens, and the device 90 operates in the nonsaturation region.

Figure 6:
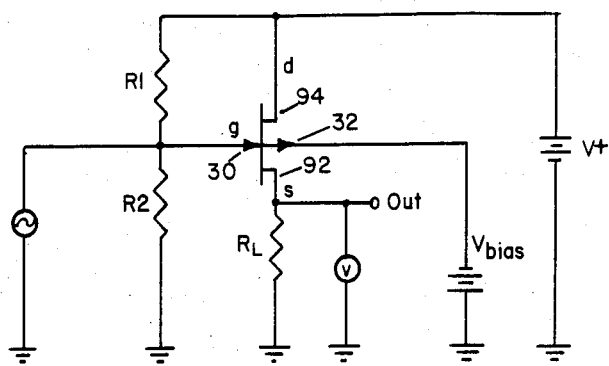
FIG. 6 is a schematic diagram of a common drain amplifier showing how the MFET of my invention can be used in such an amplifier.
Figure 7:
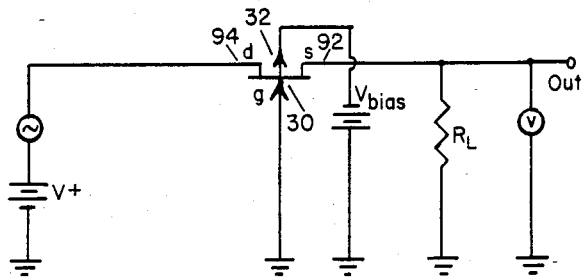
FIG. 7 is an schematic diagram of a common gate amplifier demonstrating use of my invention in that configuration.
Figure 8:
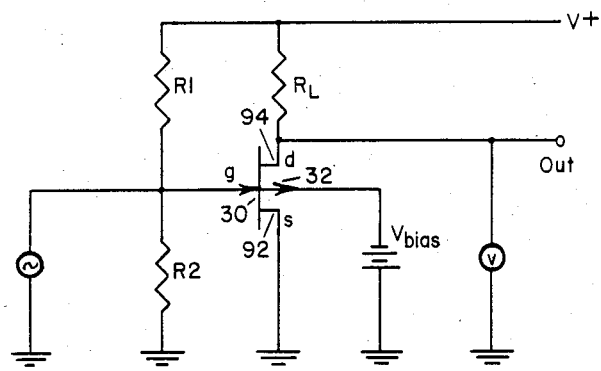
FIG. 8 is a schematic diagram of a common source amplifier demonstrating the use of my invention in that configuration.

In this manner a potential change applied to the gate 30 of the MFET 90 relative to the intervening layer 32 can cause opening and closing of the channel 34. The varying potential can also be applied between the gate 30 and channel 34, source 92 or drain 94, again causing the opening or closing of the channel 34. As shown in FIG. 6 through 8 my invention 90 can be used in conventional circuit configurations for three terminal devices with a fixed bias voltage or potential applied between the intervening layer 32 and the common element 30, 92 or 94. In this manner the device 90 will function indentically to a standard field-effect device in either an enhancement or depletion mode and can be used to replace conventional field-effect devices. It is also possible to add a varying signal to the bias applied to the intervening layer 32 so that the device 90 is used as a four terminal device with four active terminals.

FIG. 6 is a common drain amplifier configured to operate as a source follower. The first potential, V+, is applied to the drain 94 to cause current flow through the channel 34. The bias voltage Vb reverse biases both the channel 36 and the gate 30 junctions, 24 and 22, being connected directly to the intervening layer 32 and to each of the other electrodes 30, 92, 94 through the external circuit elements. A variable voltage is applied between the gate 30 and drain 94 which causes the depletion region 38 of the gate 30 in the intervening area 32 to merge with the channel depletion region 40 in the intervening layer 32 thereby changing the channel depletion region 42 in the channel 34 and controlling the current through the channel 34 producing the output voltage which is detected off the source 92.

FIG. 7 shows a common gate amplifier using my invention. A bias voltage Vb is applied between the intervening region 32 and the gate 30 and to both source 92 and drain 94 through the external circuit elements to reverse bias both junctions 22, 24 and to cause the depletion regions 38, 40 to merge in the intervening region 32. The potential difference between the drain 94 and source 92 is established by the power source, V+, and the variable voltage. The variable voltage is applied between the source 92 and the gate 30. Thus, the change in the varying potential causes variation in the channel 34 opening and in this manner controls the impedance between the source 92 and the drain 94.

FIG. 8 is a common source amplifier configuration using my invention. The bias voltage Vb is applied between the intervening layer 32 and the channel 34 through the source 92 connection. The external circuit elements comprise the means for reverse biasing the junction 22 between the intervening layer 32 and the gate 30. The drain 94 to source 92 voltage, V+, is applied to the drain 94 through the load resistor and the variable voltage is applied between the gate 30 and the source 92. The output voltage is taken between the drain 94 and the source 92 as is conventional in circuits of this design.

Figure 9:
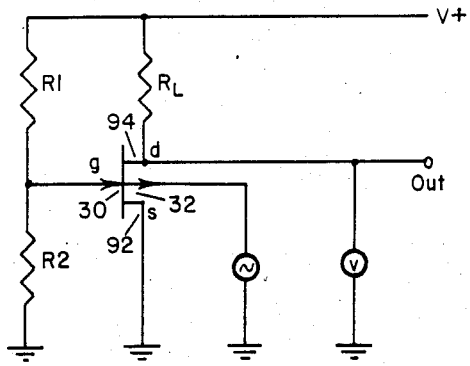
FIG. 9 is a schematic diagram showing use of my invention in a common source configuration wherein the variable potential or voltage used to control channel conductance is applied to the intervening layer.

FIG. 9 shows a common cource configuration but with the variable voltage applied between the intervening layer 32 and the source 92 and between the intervening layer 32 and the gate 30 through the external circuit. The varying voltage in this configuration varies the depletion region 38, 40 of both the channel 34 and the gate 30 in the intervening region 32. Consequently, the varying signal causes both merger of the depletion regions 38, 40 in the intervening layer 32 as well as changes to the channel depletion region 40 in the intervening layer 32, which is reflected or mirrored in the channel depletion region 42 in the channel 34, thereby causing the change in impedance or conductivity of the channel 34.

Figure 10A:
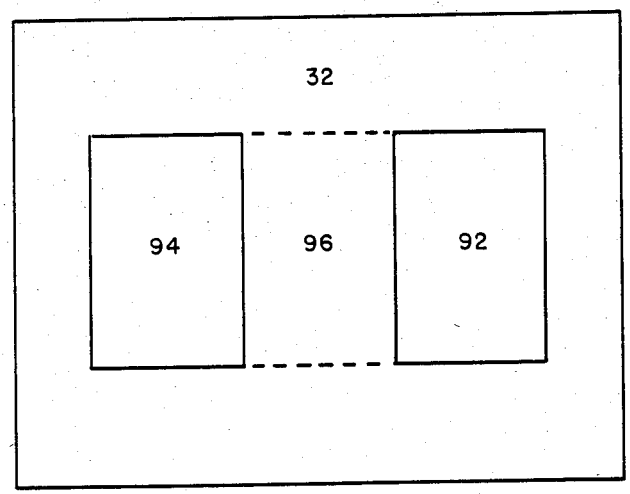
FIGS. 10a and 10b is a cross section of the horizontal embodiment of my invention shown in FIG. 1 showing the N conductivity type gate separated from the N conductivity type source, drain and channel by a P type epi layer.
Figure 10B:
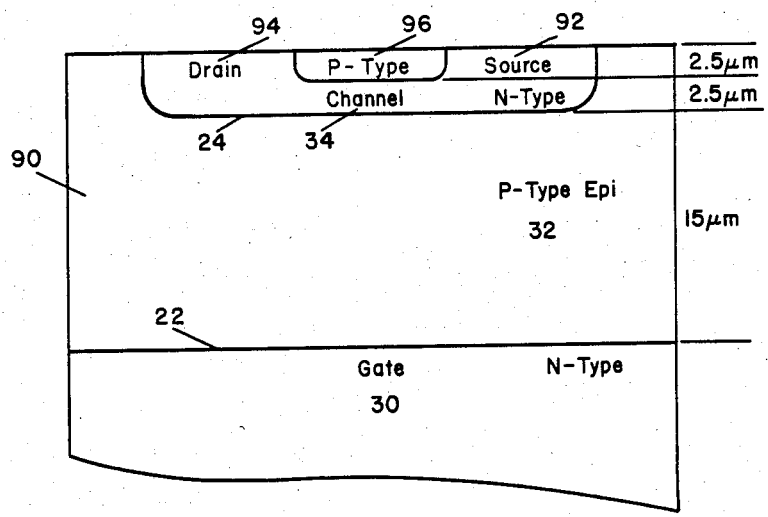

A test device was constructed to show that the device 90 would operate. This device 90 is shown in FIGS. 10 and 11 and was constructed as follows. Wafers were utilized having an epitaxial layer 32 doped oppositely to that of an N-type semiconductor material layer 30 doped with antimony and having a resistivity of 0.02 ohm-centimeter. The P-type epi-layer 32 was boron doped with an impurity concentration of $5 \times 10^{14}$ and 20 micrometers thick.

Construction of the device was completed by difusihg a light N region 34, 92, 94 into the P-type epi-layer 32. A P+ diffusion 96 was then applied over the N diffusion which narrowed the N diffusion and produced the channel 34. This P diffusion 96 connected directly to the epi-layer 32.

The N regions 34, 92, 94 were diffused to a depth of 5 micrometers and a surface concentration of $2.5 \times 10^{16}$ A/cm$^3$ which was followed by the P diffusion 96 to a depth of 2.5 micrometers and a surface concentration of $1 \times 10^{17}$ A/cm$^3$. For this device 90 the pinch-off voltage was 8.2 volts which was below the avalanche breakdown voltage of the junctions. The threshold voltage Vt was calculated to be 15 volts. The threshold voltage is that voltage applied to the gate 30 just necessary to start the channel 34 conducting when the source 92 is just biased to pinch-off.

The steps used to construct the device 90 are shown in FIG. 11. Photographic techniques were utilized to construct photomasks which were then used to mask off the surfaces by photolithographic techniques. The surface layer was then etched to control where the diffusion was to take place.

Diffusion masks of silicon dioxide were used to mask the wafer. An oxide thickness of 0.30 micrometers was found to be sufficient to insure that a pattern remained after the dopant source was removed. This oxide was grown in steam at 1,100 degrees centigrate for 20 minutes. After the oxide was grown, the diffusion pattern was etched in the oxide using standard semiconductor photolithographic techniques and an HF etch.

A two-step diffusion was performed. With this type of diffusion, an erfc diffusion was first performed to place a fixed quantity of impurities into a thin layer near the surface of the wafer. After this predeposition, a drive-in was performed to produce the proper Gaussian profile. The dopant sources used were liquid boron and liquid phosphorous.

After the oxide was etched, the wafer was coated with a phosphorous source. The times of the predepositions and drive-ins were varied. The P diffusion with the boron source was done in the same way using the same techniques. All the oxide was removed from the wafer when the boron dopant was removed. While all characteristics could not be checked on this test device, sufficient testing was accomplished to show that the device would operate as intended.

FIG. 12 shows two additional embodiments of a horizontal MFET. As shown in FIG. 12b the gate 30 spans the length of the channel 34 and is created by diffusing a N region in the P-type substrate 32' prior to growing the P-type epi layer 32. A semiconductor interconnect 200 is diffused into the substrate 32' at the same time as the gate 30. The channel 34 is a shallow N diffusion into which is diffused a shallower P diffusion 96 to form the source 92 and drain 94 electrodes. The surface gate contact 30' is a deep N+ diffusion from the surface of the epi layer to reach the gate interconnect 200. In this manner means to contact all regions exist on the surface of the device 90.

Figure 12A:
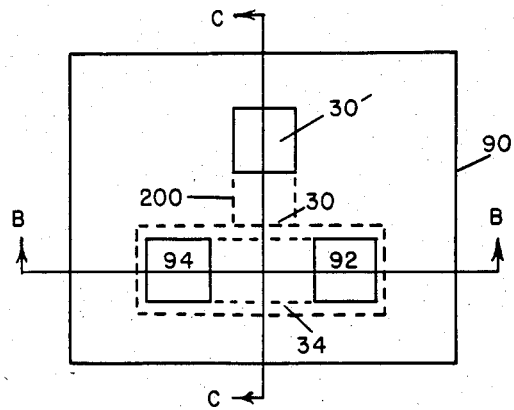
FIGS. 12a through 12d, shows manufacturing details of horizontal MFETs similar to the MFET's shown in FIGS. 2 and 4 with the gate contact brought to the surface or on the surface.
Figure 12B:
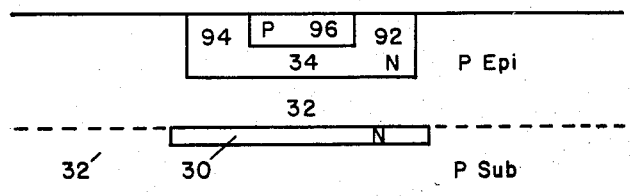
Figure 12C:
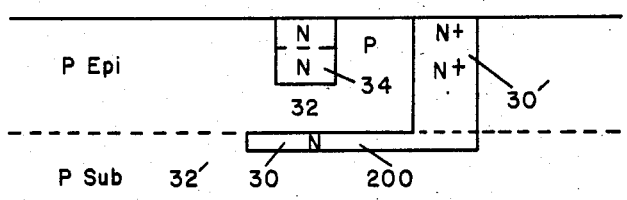
Figure 12D:
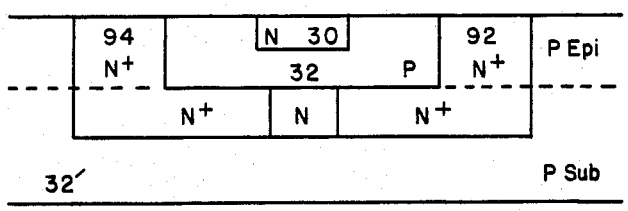

FIG. 12d shows a cross section of the embodiment of FIG. 4. Using a slow diffuser two N+ regions and an N region are diffused into a P-type substrate 32'. Since the gate region 30 is to be diffused into the surface between, but spaced from, the source 92 and drain 94 contacts, in order for the gate 30 to span the length of the channel 34, the N+ regions are necessary. In this manner the more lightly doped channel 34 will pinch off while the depletion regions 42, 43 in the N+ regions remain open because of the heavier doping. A fast N diffuser is then used in regions 204 and 206 on the surface of the substrate 32', an epi layer 32 is grown, and an N type fast diffuser is deposited on the surface of the epi layer in regions 214, 216 for the source 92 and 94 contacts as well as for the gate region 30. A drive in diffusion is performed so that the source and drain contacts 92, 94 form as well as the gate region 30. All regions 30, 32, 92, 94 can be contacted on or in the surface with conventional means or with semiconductor interconnects 200.

FIG. 13 illustrates the basic steps that can be used to construct the vertical MFET 90 of FIG. 3. FIG. 13a shows the first step used to make the device 90. For illustration purposes the device 90 shown is an N channel 34 device but it is quite obvious that P channel 34 devices 90 can just as easily be made by reversing the type material in each step. The first step is to diffuse an N region 300 into the conventional substrate 32' using a slow diffuser. This region will form a lower interconnect 200. As shown in FIG. 16, showing two MFET's 90, 90' connected together, for integrated circuity the N diffusions 300 in the substrate 32' can also be used to form lower gate 30, source 92, and drain 94 regions as well as semiconductor interconnects 200. There are several other variations that can be taken at this point which will be described later.

The second step is to implant both N regions 202, 204, 206 and P regions 201, 203, 205, 207 using a fast diffuser on the surface 103 of the wafer 32'. These regions 201–207 will out diffuse into the epi layer 105, grown in the next step, FIG. 13c. The epi layer 105 shown is a P-type epi layer. Since all regions 201–207 and 211–217 in the epi layer 105 are out-diffused from below and in-diffused from the top, the epi layer 105 material can be either N or P and can be selected to provide the optimum doping profile of the channel 34 and/or the intervening layer 32. After the epi layer 105 is grown, the surface 104 of the wafer is again implanted with both N regions 212, 214, 216 and P regions 211, 213, 215, 217. These regions 211-217 are aligned with the corresponding regions 201-207 on the bottom. After this second implantation the wafer is subjected to a drive-in step in which the two predepositions in and out diffuse into the epi-layer 105. The point where the indiffusions 231-237 and out diffusions 211-227 meet are more lightly doped than the implanted regions 201-207 and 211-217 and thus the center of the channel 34 and intervening layer 32 will be where pinch-off occurs when used as a MFET channel 34 and where the depletion regions 38, 40 merge when used as the intervening layer 32 between gate 30 and channel 34.

If desired, the final step can also include, as shown in FIG. 16, the diffusing in of top interconnect regions 200. As shown in FIG. 13f, the surface of the wafer at this point is still single crystal silicon and thus additional processing such as a second epi layer or other polysilicon interconnects or load resistors can easily be added as can metal interconnects. It is also possible to produce MOS transistors on the surface for an additional level of active devices.

Figure 15A:
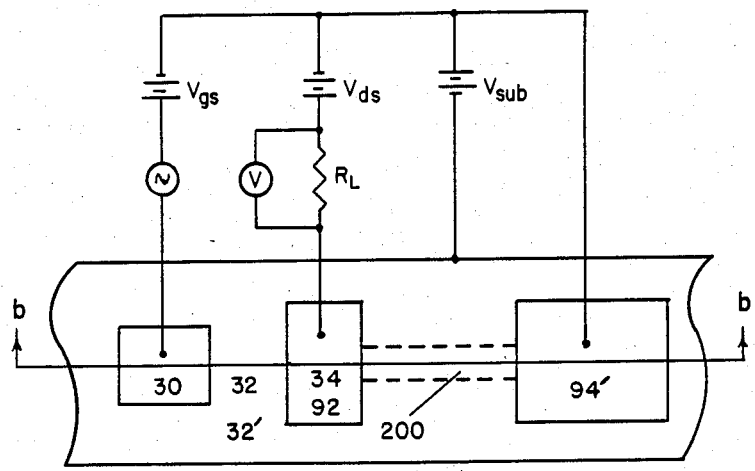
FIGS. 15a and 15b, show in FIG. 15a a top view of the vertical MFET of FIGS. 3 and 13 with the source of drain contact brought to the surface. As schematically diagrammed in FIG. 15a the drain contact is being brought to the surface.
Figure 15B:
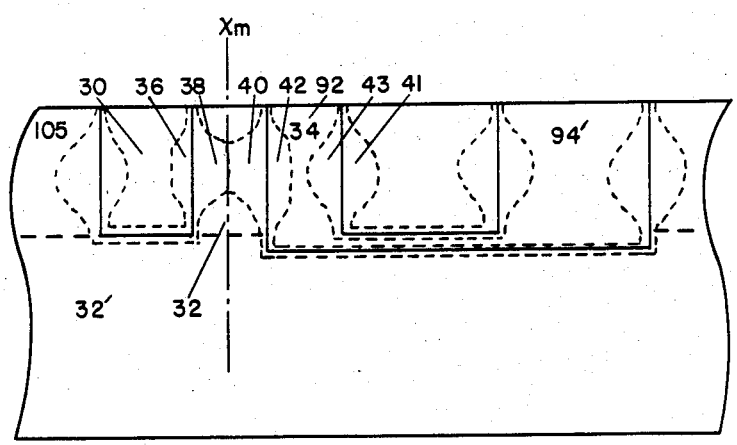

The resulting device 90 is shown in FIG. 15 with depletion regions 36, 38, 40, 42 which result from the non-uniform doping profile. As can be observed at the lightly doped center of the intervening layer 32, where in diffusion 233 meets out diffusion 223, the depletion regions 38, 40 will merge, and the channel 34 length and position is determined by the indiffusion 234 and out diffusion 224 in the channel 34 region.

Schematically shown in FIG. 15a are the connections to the device 90 for a common source 92 amplifier. As schematically diagramed the lower electrode 204 is used as the drain 94 and brought to the surface 101. The gate 30 is preferably narrower than the channel 34 and the surface contact 94' is preferably physically larger than the channel 34 to be sure it does not pinch off.

Doping and spacing of the gate 30 to channel 34 is discussed below in connection with FIG. 14 and produces different operating characteristics for the basic device structure shown in FIGS. 3, 13 and 15.

The ease with which the invention lends itself to integrated circuitry is shown in FIG. 16 which uses the same construction steps as those discussed in connection with FIG. 13.

FIG. 16 shows two MFETs 90, 90' connected together. The output of the MFET 90 on the right is directly connected to the gate 30 of the MFET 90' on the left through the use of a bottom interconnect 200. The MFET 90 on the right has its drain 94 on the bottom while the MFET 90' on the left has its drain 94 on the top. The MFET 90 is the only device that can take advantage of the lower interconnect 200 since it is the only device whose output and input are of the same type material without any isolation regions in between.

The gate 30 of the left MFET 90' is shown going to the surface. In actual practice this is not necessary. It need only extend far enough to be able to merge its depletion 38 region with that of the channel 34. Also, the gate region 30 can extend from the top as well as the bottom if that eases the circuit layout. To prevent the gate 30 from extending across the epi-layer 105 it is only necessary to make the opposing predeposition 202 or 212 of a type opposite to that of the gate 30. By controlling the ratios of the two predepositions, the top 201-207 and bottom, 211-217 it is possible to control the depth at which the drive-in diffusions meet and in fact it is possible to have different regions 30, 32, 34 meet at different depths which can result in certain added advantages. In FIG. 16f if the two channels of the two MFETs are at different depths it is possible to eliminate the intermediate gate region 30, gate 2, altogether. If the depth of the MFET channel 34 of the left MFET 90' is greater than the channel region 34 of the right MFET 90 then it is possible to move the right MFET 90 next to the left MFET 90' where the drain region 94 of the right MFET 90 will act directly on the channel region 34 of the left MFET 90'.

As discussed above, there are a large number of ways to implement the vertical structure of the MFET and it is impossible to cover every variation such as multiple gate 30, configurations controlling current through a single channel 34, current flow through multiple channels 34 controlled by a single gate 30, or the mutual control of multiple channels 34 interconnected by their merged depletion regions 40, 40'. The important thing is that it is possible to construct and interconnect MFETs 90 in a variety of ways and that it thus is a useful and versatile circuit element and can be constructed using the techniques that are standard practices in the semiconductor industry.

FIG. 14 shows the gate 30 and channel 34 of the vertical MFET of FIG. 13 with the intervening layer 32 with a bottom interconnect 200 which can be used to interconnect the device 90 to another device or can be used to bring the electrode 92 to the surface as shown in FIG. 15. The various plots, as will be discussed in more detail below, show the effect of varying the doping and the spacing D between gate 30 and channel 34. Regions 222 and 232 are the gate 30 while regions 204, 214 are interchangeable as the source 92 and drain 94. Where regions 224 and 234 meet, the concentration is selected to give the required channel 34 concentration to produce pinch-off at the required voltage and this concentration can be controlled by the implanted impurities and by the drive-in step.

Because of the diffusion profiles both the N and P regions 221-227, 231-237 will be lightly doped near the center of the epi-layer 105 with the doping becoming heavier toward the upper and lower, 101, 102 surfaces. These heavily doped regions 201-207, 211-217 provide a low resistance path from the lightly doped regions to the surfaces 101, 102. The heavily doped regions also prevent the gate 30 and channel 34 depletion regions 38, 40 from merging in areas where the gate 30 does not control the channel 34. This capacitive coupling is an unwanted parasitic capacitance.

Figure 14A:
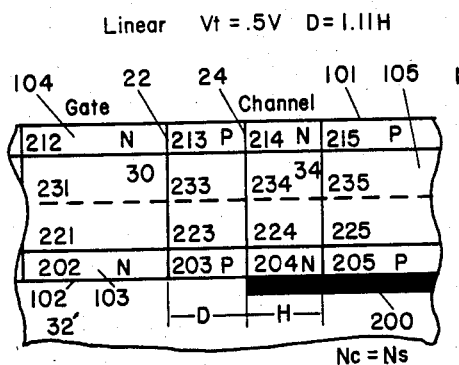
FIGS. 14a–14t, shows in FIGS. 14a–14d several configurations of a vertical junction field-effect transistor for use in integrated circuitry, and FIGS. 14e–14t graphically show the changes in E field of the device due to changes in configuration, doping and applied biases.
Figure 14B:
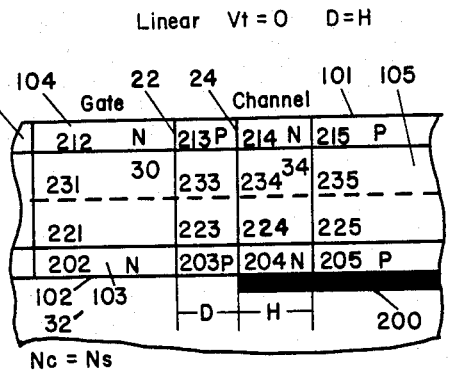
FIG. 14, comprising
Figure 14E:
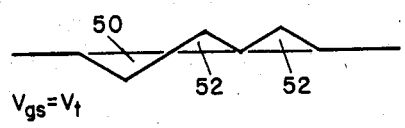
Figure 14I:
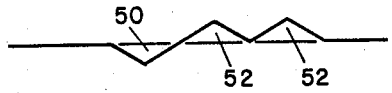
Figure 14F:
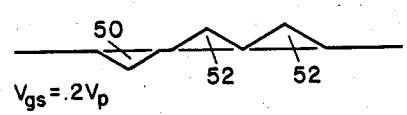
Figure 14J:
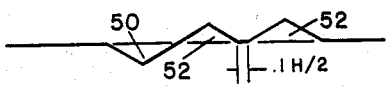

In this structure the length of the channel 34 will be only that portion of the channel 34 where the impurity concentration is low enough to allow the channel 34 to pinch-off at the required voltage For the purpose of analysis of operation it can be assumed that the P regions 32 are grounded. The plots of the E Fields in FIG. 14, FIGS. 14e-14t, represent the E Fields of the device 90 sectioned through the minimum doping level near the middle of the epi-layer 105 as shown by the dotted line. All the potentials are normalized to the voltage necessary to pinch-off the channel; that is, all voltages are measured as multiples of the pinch-off voltage, Vp. All dimensions when given are normalized to the channel height, H.

In most applications the device will be operated in the enhancement mode; thus a potential must be applied to the source 92 equal to Vp to pinch-off the channel 34. Since this is a bias voltage across a reverse biased P-N junction 24, the current that must be supplied will only be the leakage current of the junctions. This potential can be supplied by a bias supply off the chip or a standard on chip charge pump technique can be used as is now commonly used for substrate bias in NMOS circuits.

To maximize performance, the channel 34 should have as low a resistance as possible and the influence of the gate 30 on the channel depletion region 42, should be maximized. To lower the resistance of the channel 34, it should be as heavily doped as possible. Since the doping is fixed by the pinch-off voltage requirements and the channel height, H, the only other way to reduce the channel resistance is to shorten the length of the channel pinch-off region. The limits on the length of the channel 34 are set by the avalanche breakdown characteristics of the channel 34 at the applied drain to source voltage.

The second method of enhancing the performance of the device, 90, that of maximizing the gate 30 influence on the channel depletion region 42, is illustrated in the series of plots of the E Fields in FIG. 14. The plots, FIGS. 14e–14t, are arranged horizontally according to the configuration of the device 90 and the threshold voltage and arranged vertically according to the normalized applied gate voltage. In these figures the degree of channel opening is a relative measure of the gain of the device. The gain of all field-effect devices is really determined by the number of charges under the gate area and is thus a function of the gate capacitance and the impurity concentration under the gate. In FIG. 14 the gate capacitance increases from left to right as does the gain.

The first column in FIG. 14, FIGS. 14e–14h, consists of the E field plots of a linear device, the gate concentration equal to the channel concentration, with a threshold voltage of 0.5Vp. In all the figures, the area under the E Field 52 will be equal to the pinch-off voltage while the area under the E Field 50 will be equal to the gate voltage. The first row in FIG. 14, FIGS. 14e, i, m and q, shows the threshold voltage and is equal to area 50 minus area 52. The second row, FIGS. 14f, j, n and r, indicates the E Fields 50, 52 when input voltage is 0.2Vp and for this case since it is below the threshold voltage, the gate and channel depletion regions 38, 40 have not merged. The third row, FIGS. 14g, k, o and s, shows the input voltage equal to Vp and for this configuration, the channel opening is 0.2H/2. The last row, FIGS. 14h, l, p and t, shows the maximum voltage that can be applied to the gate 30 without the gate 30 punching through to the channel 34 and in this case it is equal to 3.93 Vp. For this linear device the channel doping and the substrate doping are equal.

The second column FIGS. 14i–l, shows a linear configuration with the threshold voltage equal to zero. As can be seen from the figures, the channel 34 opens further than for the configuration shown in the first column. To lower the threshold voltage the gate 30 to channel 34 spacing D has been decreased and is now equal to the channel height, H; thus the gate capacitance increases and the increase is reflected in the channel opening. It also results in a reduction in the maximum voltage that can be applied to $3V_p$.

The third column FIGS. 14m–p shows a quadratic configuration with the threshold voltage equal to zero and with the channel concentration equal to the substrate concentration. That this is a quadratic device, the gate concentration not equal to the channel concentration, can be seen by the vertical drop of the E Field 50 in the gate 30 region. The gain also increases because there is greater charge adjacent to the gate capacitance depletion region which increases the gate capacitance. $V_{max}$ is now reduced to 1.9Vp.

Figure 14G:
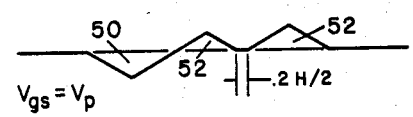
Figure 14K:
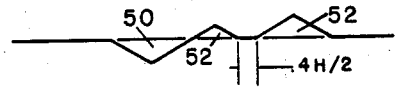
Figure 14H:
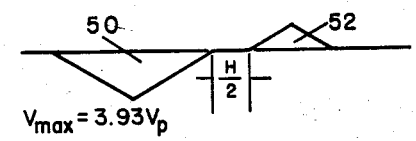
Figure 14L:
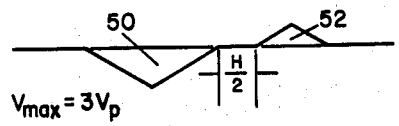
Figure 14C:
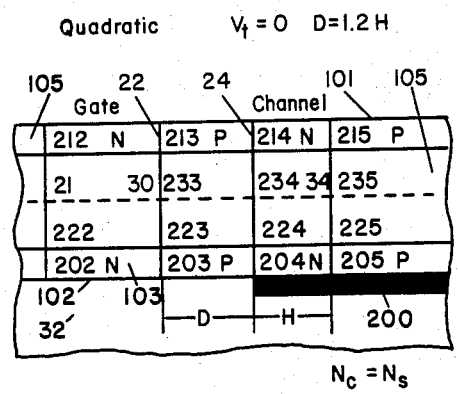
Figure 14D:
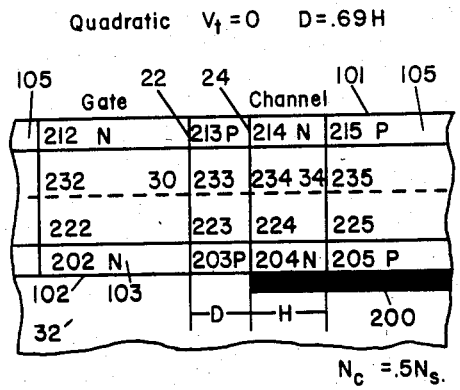
Figure 14M:
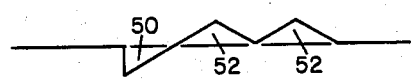
Figure 14Q:
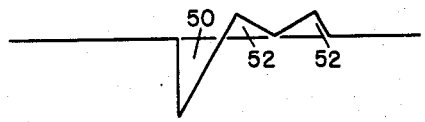
Figure 14N:
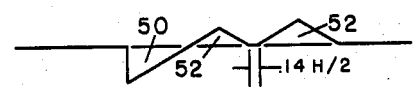
Figure 14R:
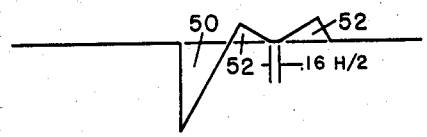
Figure 14O:
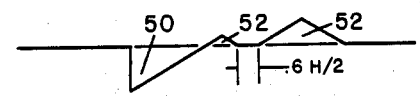
Figure 14S:
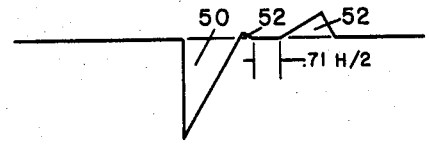
Figure 14P:
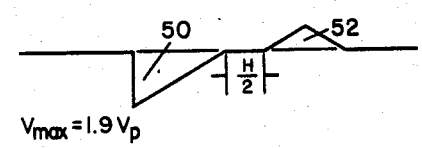
Figure 14T:
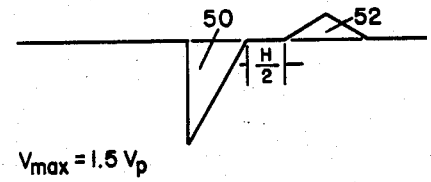

The last column FIGS. 14g–t shows a quadratic configuration with the threshold voltage equal to zero but with the substrate doping twice that of the channel. The gate 30 to channel 34 separation D decreases; thus the capacitance increases. $V_{max}$ is now 1.5Vp.

This method of control can be utilized in certain logic functions to implement an NOR function. As shown in FIG. 17 if a vertical device has two gates 30 on opposite sides of the channel 34 and the source 92 is just at pinch-off, if either gate potential is increased, current will flow in the channel 34. This will implement an OR function. If the channel 34 is a square with four equal channel sides, the channel 34 will pinch-off from all sides. If the gates 30 are on opposite sides of the channel 34 they will open the channel 34 from that side but the channel 34 will still pinch-off from the sides at right angles to the gate side of the channel 34. It is thus necessary for two gates 30 to be at right angles to each other as shown in FIG. 18 and both gates 30 to have a high potential if the current is to flow in the channel 34. This will produce an AND function.

Figure 17A:
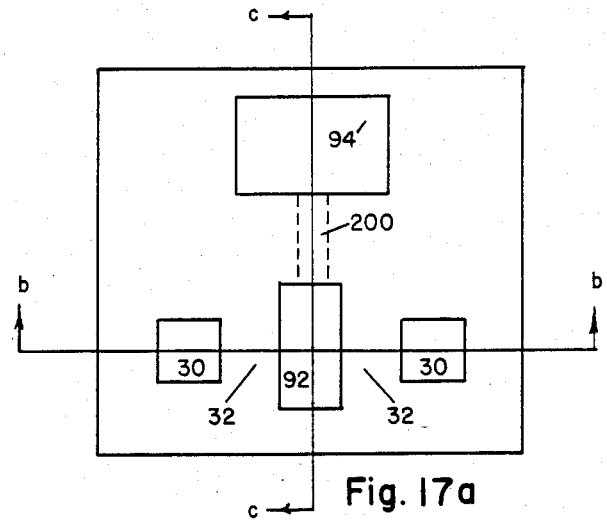
FIGS. 17a through 17d, shows a further embodiment of my invention wherein the MFET is constructed to perform the function of a NOR gate wherein two gates are used on opposing sides of a vertically oriented channel.
Figure 17B:
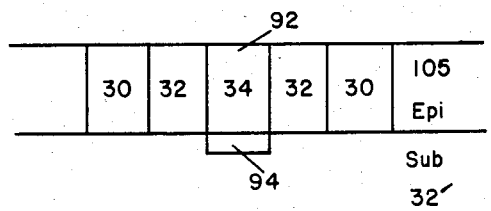
Figure 17C:
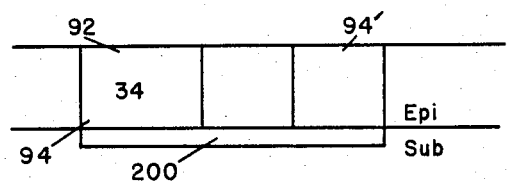
Figure 17D:
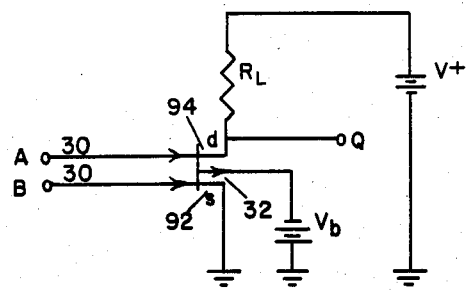
Figure 18A:
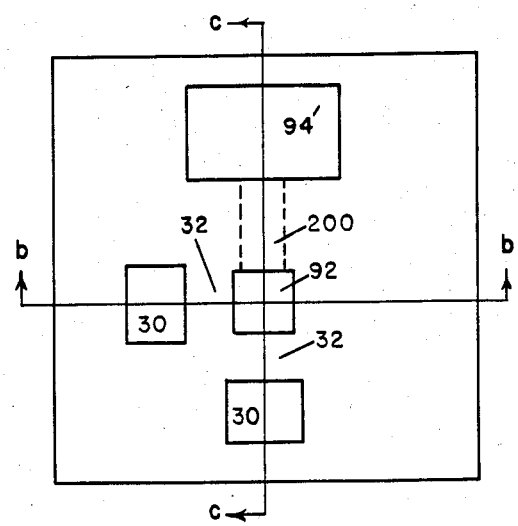
FIGS. 18a through 18d, shows my invention constructed to perform a NAND gating function wherein gates are at right angles to each other on adjacent sides of a vertically oriented channel.
Figure 18B:
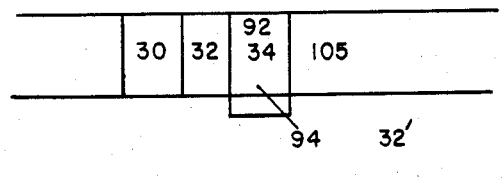
Figure 18C:
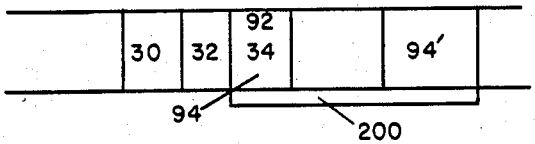
Figure 18D:
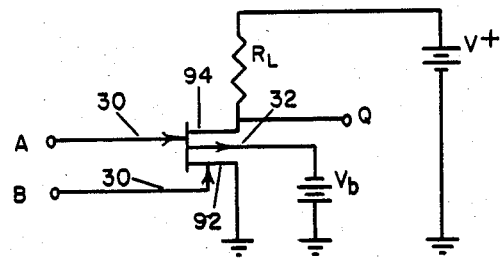

As shown in FIGS. 17d and 18d the electrical connection to the MFET 90 used as a logic element are conventional, the only difference being the bias, $V_b$, to the intervening layer 32 which, as shown, can be connected between the intervening layer 32 and the source 92.

The fundamental equations for control with merged depletion regions without punch through, has been developed which relates to the two bias voltages Vc and Vg to the depletion layer width $h_1$. The other depletion layer widths can be obtained from the following relationships.

$$h_2 = \frac{Nc}{Ns} h_1$$

$$h_3 = D - h_2$$

and $$h_4 = \frac{Ns}{Ng} h_3$$

where

NC = the impurity concentration in the N region 34, $A/cm^3$

Ns = the impurity concentration in the P region 32, 33, $A/cm^3$

Ng = the impurity concentration in the N region 30, $A/cm^3$

D = the distance between the two junctions, cm.

The fundamental equation is obtained by integrating the $\xi$ fields 50, 52 across the junctions 22, 24 and applying suitable limits which result in the following equation.

$$\frac{2\epsilon(Vc - Vg)}{q} = \left(1 - \frac{Nc}{Ng}\right) Nch_1^2 + 2\left(1 + \frac{Ns}{Ng}\right) Nch_1 D - \left(1 + \frac{Ns}{Ng}\right) NsD^2$$

where

ε = the permittivity of the material, F/cm
q = the charge of an electron, C

This equation can be solved explicitly for $h_1$ and will result in two forms depending on the ratio of the impurity concentrations Nc/Ng which if equal to one results in a linear equation since the quadratic term drops out. The solutions are $$h_1 = \frac{\epsilon(V_c - V_g)}{qN_s(K_c + 1)D} + \frac{D}{2K_c}$$

for the linear case and $$h_1 = \left( A \frac{2\epsilon(V_c - V_g)}{qN_s} + CBD^2 \right)^{\frac{1}{2}} - BD$$

for the quadratic case where
A = Kg/(Kc(Kg−Kc))
B = (Kg+1)/(Kg−Kc)
C = ((1/Kc)+B)
Kg = Ng/Ns
Kc = Nc/Ns To achieve a linear device with the horizontal embodiment 90 shown in FIG. 1, a substrate 32' with a known impurity concentration can be used as the gate 30. A first epi layer can be grown for the intervening region 32. A second epi layer can be grown for the channel 34 region with the same impurity concentration as the substrate gate 32', 30. Into this second epi layer, if N-type, P regions can be diffused outside of the channel area and a shallow P region 96 in the channel area to narrow the channel 34 and form source 92 and drain 94.

Verticle devices with a linear relationship between the channel depletion region 42 width $h_1$ and the applied gate voltage Vg is easily achieved. Since the gate 30 and channel 34 are diffused at the same time using the same drive in step, applying the same amount of dopant to each region 202, 204, 212, 214, will produce the same impurity concentration at each level of the device 90.

These equations are only valid between the limits of punch-through and where the depletion regions 38, 40 no longer merge. The equations are in terms of absolute potentials referenced to the intervening layer 32 but it is more useful to consider the potential difference Vc−Vg = Vcg and assume that the absolute potential is sufficient to keep the regions 38, 40 merged.

The contact potentials have not been included but can be added to Vcg. For the linear case the contact potentials cancel; thus they need not be considered. For the quadratic case it is the difference in contact potential and not its absolute value that must be added to or subtracted from Vcg.

Punch-through can be determined from the equations since it will be the potential difference Vcg necessary to cause $h_2$ to be equal to zero for Vg punching through to Vc and will be the potential difference Vcg necessary to cause $h_3$ to equal zero for Vc to punch through to Vg. For the linear case the potential applied to cause the left depletion region 38 to punch through to the right 40 must equal the potential that causes the right 40 to punch through to the left 38. For the quadratic case this is not true.

The capacitance of these merged depletion regions will now be that of a capacitor with a depletion region dielectric but the two plates will now be the two N regions 30, 34 instead of one N and one P region. Because the width of the depletion region 38, 40 is now equal to twice the separation D for Nc = Ns, the capacitance of a junction merged with depletion region of another junction is less than that of the unmerged junction. The capacitance per unit area for two merged depletion junctions is $$C = \left( \frac{K_c}{K_c + 1} \right) \left( \frac{\epsilon}{D} \right)$$

for the linear case and $$C = K_c A \epsilon \left( \left( \frac{2\epsilon(-V_{gc})}{qN_s} \right) + CBD^2 \right)^{-\frac{1}{2}}$$

for the quadratic case. It is evident from the equation of the linear device that not only is the capacitance reduced, it is independent of the applied biases.

Operational Characteristics

In operation, the channel 34 of the device 90 can be pinched off by applying a voltage to the source 92 that is greater than Vp, the voltage that causes the depletion region 42 in the N region 34 to close off the source end 92 of the channel 34. If the drain 94 is then made more positive than the source 92 and with the gate 30 unbiased, the entire channel 34 is pinched off and no current will flow. If the drain voltage is increased the current still will not change. If a positive voltage is applied to the gate 30, the gate depletion region in the substrate 38 will merge with the depletion region of the channel in the substrate 40. If the gate potential is further increased, the depletion region in the channel will narrow and the channel 34 will open and current will flow. When operated in this manner, the device operates like an enhancement mode JFET, one that is normally off until a gate signal turns it on.

The fundamental equation relating the two bias voltages Vc and Vg to the depletion layer width $h_1$, and the other depletion region widths, is stated above. The threshold voltage Vt, the voltage necessary to just start the channel 34 conducting, occurs when the source end 92 of the channel 34 just starts to open. It is determined by the merged depletion equation and, therefore, the threshold voltage Vt is a function of the gate 30 to channel 34 spacing and can be altered within any circuit by the design layout. If a channel 34 of width H, having P and N concentrations of Ns and Nc, respectively, is to pinch off, it is essential that D Ns > (H/2)Nc. If this equation does not hold, there will be insufficient charge in the P region 32 to balance the charge in the N regions 30, 34.

DC Characteristics

The DC characteristics of the device 90 can be obtained by solving the merged depletion equation for $h_1$ and substituting it into the channel equation for a junction field-effect transistor. Because there are two solutions to the equation, there will be two sets of characteristics based on the linear and quadratic solutions.

The device in operation will have a linear and saturated region. Saturation will occur when the drain to source voltage Vds is greater than the gate to source voltage Vgs, minus the threshold voltage Vt. The drain current for the linear case, when the gate and channel depletion regions 38, 40 have merged, can be expressed as follows:

$$Ids = \frac{\sigma W}{L}\left(\left(H - \frac{D}{K}\right) - \left(\frac{\epsilon(Vds - 2Vgs)}{qNs(K+1)D}\right)\right) Vds$$

where
Ids = the drain to source current, Amps,
$\dot{=}$ = the channel conductivity, mhos,
W = the effective channel width, cm,
Vds = the drain to source voltage, Volts,
H = the channel height, cm,
K = the N to P impurity concentration ratio,
Vgs = the gate to source voltage, Volts,
L = the channel length, cm.

If the threshold voltage is referenced to the source, then, $$Vt = -\frac{qNs(K+1)D}{2\epsilon}\left(H - \frac{D}{K}\right)$$

and the drain current in the linear region of operation is given by $$Ids\ lin = G(2\ (Vgs - Vt))Vds$$

where G is the amplification factor given by G = G'(W/L) and $$G' = \frac{\sigma \epsilon}{qNs(K+1)D}$$

The linear drain current occurs when Vds is much less than Vgs−Vt. The saturation current is found by the following expression.

$$Ids\ sat = G(Vgs - Vt)^2$$

The term (Vgs−Vt) is the change in the gate to source voltage above the gate to source threshold voltage; thus (Vgs−Vt) is a measure of how much the device 90 is turned on. The threshold voltage Vt can be positive or negative since it is referenced to the source which will be above the substrate ground. For example, if the source 92 is biased at 5 volts which pinches off the channel 34, and if the channel depletion region 40 reaches all the way to the gate depletion region 38 with the gate 30 unbiased, the channel 34 will begin to conduct when any potential is applied to the gate 30. The absolute threshold voltage will be at a gate to substrate voltage of zero volts but the relative gate to source threshold Vt will be −5 volts. For a linear device, a threshold voltage of zero volts will occur when the channel depletion region 40 at pinch-off in the P region 32 extends exactly halfway between the gate 30 and channel 34. If it extends less than halfway, the threshold voltage will be positive.

An approximate value for the maximum gate voltage can be obtained by applying a gate voltage that will bring the depletion region to the N side of the channel junction h₁, to zero. This can be stated as follows:

$$Vgs\ max = \frac{qNs(K+1)D^2}{2K\epsilon}$$

This approximation ignores the contact potential. Saturation occurs when the drain voltage is high enough to cause the drain end of the channel 34 to pinch off. For the linear device this will occur when the drain to source voltage is greater than the gate to source voltage minus the threshold voltage; thus $$Vds\ sat = (Vgs - Vt).$$

The transconductance of the device is determined by the following two formulas. For the linear region $$gm\ lin = 2GVds$$

and for the saturation region $$gm\ sat = 2G(Vgs - Vt).$$

The gain term of the device can be written as $$G = \left(\frac{W}{L}\right)\left(\frac{\mu_c K \epsilon}{(K+1)D}\right)$$

where $\mu_c$ is the channel mobility.

While the linear embodiment of the invention can have a gain equal to or greater than conventional MOS devices, the quadratic embodiment will have a greater gain than the linear device.

The drain current for the quadratic device can be expressed as $$Ids = \frac{\sigma W}{L}\left((H + 2BD)Vds - \frac{4}{3}\sqrt{\frac{2A\epsilon}{qNs}}\left((Vds - Vgs) + \frac{CBD^2 qNs}{2A\epsilon}\right)^{3/2} - \left(-Vgs + \frac{CB(D^2)qNs}{2A\epsilon}\right)^{-3/2}\right)$$

where
A = (Kg/(Kc(Kg−Kc))
B = (Kg+1)/(Kg−Kc)
C = ((1/Kc)+B)

The threshold voltage for the quadratic device can be expressed as $$Vt = -\frac{qNs}{2A\epsilon}\left(\left(\frac{H}{2} + BD\right)^2 - CBD^2\right)$$

The maximum voltage that can be applied to the quadratic device is determined in the same way as for the linear device; thus $$Vgs\ max = \frac{qNs}{2A\epsilon}(C - B)BD^2.$$

The quadratic device also has a linear and saturation region of drain current. The linear region again occurs when Vds is much less than Vgs−Vt and can be expressed as $$Ids\ lin = \frac{\sigma W}{L}\left((H + 2BD) - \frac{4}{3}\sqrt{\frac{2A\epsilon}{qNs}}\left(\left(\frac{2A\epsilon Vgs}{qNs}\right)^2\right) - \right.$$

$$\left. 6\left(\frac{2A\epsilon}{qNs}(CBD^2 - Vgs) + 3(CBD^2)\right)^{\frac{1}{2}}\right)Vds$$

In the saturation region, again with Vds greater than Vgs−Vt, the drain current can be expressed as $$Ids\,sat = \frac{\sigma W}{L}\left((H + 2BD)(Vgs - V_t) - \frac{4}{3}\sqrt{\frac{2A\epsilon}{qNs}}\left(\left(-Vt + \frac{qNs}{2A\epsilon}CBD^2\right)^{3/2} - \left(Vgs + \frac{qNs}{2A\epsilon}CBD^2\right)^{3/2}\right)\right)$$

The quadratic transconductances are $$gm\,lin = \frac{\frac{8\sigma W}{3L}\left(\left(\frac{2A\epsilon}{qNs}\right)^2 Vgs - 3\left(\frac{2A\epsilon}{qNs}\right)CBD^2\right)}{\left(\left(\frac{2A\epsilon}{qNs}\right)\left(\left(\frac{2A\epsilon Vgs}{qNs}\right)^2 - 6\left(\frac{2A\epsilon}{qNs}(CBD^2 Vgs)\right) + 3(CBD)^2\right)\right)^{\frac{1}{2}}}$$

and $$gm\,sat = \frac{\sigma W}{L}\left((H + 2BD) - 2\left(\frac{2A\epsilon}{qNs}\left(-Vgs + \frac{qNs}{2A\epsilon}CBD^2\right)^{\frac{1}{2}}\right)\right)$$

AC Characteristics

As shown in FIGS. 6–9, 17 and 18 a new symbol has been developed to convey the operation of the device. The symbol is similar to the conventional symbol for the JFET but with the gate 30 arrow separated from the channel 34 while a second arrow coming from the back of the channel 34 represents the substrate 32. As shown in FIG. 6, the symbol represents an N-channel device. It is anticipated that for a P-channel device the arrows would be reversed.

The gate capacitance of the device was determined in the section on merged depletion regions and is $$C = \left(\frac{K}{K+1}\right)\left(\frac{\epsilon}{D}\right) \times \text{Area}$$

for the linear device. If K is equal to one, the gain term of the device is the same as the gain term of an MOS transistor with the gate capacitance being formed by a dielectric made up of the depletion region with width D.

For the quadratic device the gate capacitance can be stated as $$C = Kc A\epsilon \left(\left(\frac{2\epsilon(-Vgs)}{qNs}\right) + CBD^2\right)^{-\frac{1}{2}} \times \text{Area}$$

Since the gate area will equal the channel area, the cut-off frequency of the linear device can be stated as $$F_0 lin = \frac{gm}{4\pi Cg} = \frac{(Vgs - Vt)}{2\pi qL^2 KNs}$$

For the quadratic embodiment of the invention the maximmum cut-off frequency will be twice that of the linear device. In fact, the cut-off frequency of both devices is so high that in practice it will be the transit time of the carriers through the channel which will determine the highest frequency of operation. Since the transit time is a function of the channel length and maximum carrier velocity, both devices will have the same cut-off frequency. Because a vertical device with submicrometer channel lengths can be constructed, these devices should have higher cut-off frequencies than other devices.

Temperature Characteristics

A junction field-effect transistor is inherently stable with temperature. The junction field-effect device controlled by merged depletion regions will have the same channel resistivity characteristics as that of a conventional JFET with similar doping but the variation of threshold voltage with temperature will be much less for the merged-depletion devices since the threshold voltage variations are due to the change in contact potential with temperature. For the linear device there will be no change in threshold voltage with temperature since the change in the two contact potentials of the gate and channel junctions 22, 24 will be equal and thus will cancel. For the quadratic device the two contact potentials will be different but it will be the difference in the change in contact potentials that will alter the threshold voltage, thus the quadratic devices' temperature characteristics will be much better than those of a standard JFET.

Noise

Thermal noise generated in the channel 34 should be less than that of a conventional JFET since the shorter channel length increases the transconductance which lowers the channel noise resistance. Because the device can be constructed with a short channel, and since noise components are a linear function of the channel length, a low voltage device should have almost an order of magnitude improvement over the current JFET devices. Since the JFET has lower noise than MOS or bipolar devices, the MFET will have better performance over these other devices.

Those skilled in the art will immediately recognize that semiconductor devices of the present invention can assume many varied embodiments, other than those specifically disclosed herein, without departing from the spirit of the invention. The invention will have many uses both as a discrete device and particularly in integrated circuitry. It should be understood that any such modifications and variations that may be resorted to are considered to be within the purview and scope of the present invention, and it is intended by the appended claims to cover all such variations and modifications as fall within the true spirit and scope of the invention.

I claim as my invention:

1. A semiconductor device comprising:
a first semiconductor region of first conductivity type;
a second semiconductor region of second conductivity type opposite to said first conductivity type, said second region forming a PN junction with said first region;
said first region being sufficiently thin and having sufficiently low doping level that a depletion region formed by reverse biasing said PN junction can extend into said first region;
first means for electrically contacting said first region;
spaced second and third means for electrically contacting said second region;
means for applying a first constant voltage between said first electrical contacting means and said second or third electrical contacting means of a polarity to reverse bias the PN junction;
gate means contacting said first semiconductor region in a manner so as to form a potential barrier with the first semiconductor region such as to permit a depletion region to be created in the first semiconductor region upon suitable bias, said gate means being spaced from the second semiconductor region by the first semiconductor region;
fourth means for applying a signal voltage between the gate means for the first region, said signal voltage having at least intermittently a sufficient magnitude and polarity to create a depletion region in the first region which merges with the depletion region due to the reverse bias applied to the PN junction by said first voltage so that the impedance of the second region is controlled by said signal voltage.

2. A junction field-effect transistor comprising:
a channel region of a first conductivity type material having source and drain electrode regions of the same conductivity type material;
a gate electrode region of the same conductivity type material as the channel region spaced from the channel;
an intervening layer region of semiconductor material of a different conductivity type interposed between the channel region and the gate region forming junctions with the channel region and gate region, the gate region being more heavily doped than the intervening layer region;
means for reverse biasing the junctions so that depletion regions associated with each junction merge in the intervening layer; and
variable voltage means for varying the reverse bias so that changes in the depletion region associated with the gate in the intervening layer causes changes in the depletion region associated with the channel in the intervening layer thereby causing changes to the depletion region in the channel so that current flow through the channel is controlled by the variable voltage means.

3. A junction field-effect transistor comprising:
a channel region of a first conductivity type material having source and drain electrode regions of the same conductivity type material;
a gate electrode region of the same conductivity type material as the channel region spaced from the channel;
an intervening layer region of semiconductor material of a different conductivity type interposed between the channel region and gate region forming junctions with the channel region and gate region;
means for reverse biasing the junctions so that depletion regions associated with each junction merge in the intervening layer;
variable voltage means for varying the reverse bias so that changes in the depletion region associated with the gate in the intervening layer causes changes to the depletion region associated with the channel in the intervening layer thereby causing changes to the depletion region in the channel so that current flow through the channel is controlled by the variable voltage means; and
at least one semiconductor region of the same conductivity type as the source, drain and gate electrode connected to the source, drain or gate electrode to form a semiconductor interconnect.

4. A junction field-effect transistor comprising:
a channel region of a first conductivity type material having source and drain electrode regions of the same conductivity type material;
a gate electrode region of the same conductivity type material as the channel region spaced from the channel;
an intervening layer region of semiconductor material of a different conductivity type interposed between the channel region and gate region forming junctions with the channel region and gate region;
the gate region being embedded in the device and spaced from the channel by the intervening layer and surrounded on all sides by semiconductor material of the same conductivity type material as the intervening layer;
means for reverse biasing the junctions so that depletion regions associated with each junction merge in the intervening layer; and
variable voltage means for varying the reverse bias so that changes in the depletion region associated with the gate in the intervening layer causes changes in the depletion region associated with the channel in the intervening layer thereby causing changes to the depletion region in the channel so that current flow through the channel is controlled by the variable voltage means.

5. A junction field-effect transistor comprising:
a channel region of a first conductivity type material having source and drain electrode regions of the same conductivity type material;

a gate electrode region of the same conductivity type material as the channel region spaced from the channel;

an intervening layer region of semiconductor material of a different conductivity type interposed between the channel region and gate region forming junctions with the channel region and gate region;

means for reverse biasing the junctions so that depletion regions associated with each junction merge in the intervening layer;

variable voltage means for varying the reverse bias so that changes in the depletion region associated with the gate in the intervening layer causes changes in the depletion region associated with the channel in the intervening layer thereby causing changes to the depletion region in the channel so that current flow through the channel is controlled by the variable voltage means; and wherein the channel orientation with respect to current flow through the channel is perpendicular to the surface of the device.

6. A method of operating a junction field-effect transistor having a channel region of semiconductor material of a first conductivity type with spaced first and second means for electrically contacting the channel region so that current can flow therethrough, an intervening region of a different conductivity type material adjacent the channel region forming a first junction therewith with depletion regions on each side thereof, third means for electrically contacting the intervening region, a gate region of semiconductor material of the same conductivity type as the channel region adjacent the intervening region forming a second junction with depletion regions on each side thereof, fourth means for electrically contacting the gate region, the gate being spaced from the channel region by the intervening region, the method comprising:

applying a constant voltage between the third means and said first or second contacting means of a polarity to reverse bias the first junction; and applying a variable potential between any two of the means for electrically contacting the regions, the variable potential being at least intermittently of sufficient magnitude and polarity to merge the depletion regions of the gate and the channel in the intervening region, without punch through of either depletion region to either junction, whereby the impedance of the channel between the spaced first and second means for contacting the channel is controlled by the variable potential.

7. A method of operating a junction field-effect transistor having a channel region of semiconductor material of a first conductivity type with spaced first and second means for electrically contacting the channel region so that current can flow therethrough, an intervening region of a different conductivity type material adjacent the channel region forming a first junction therewith with depletion regions on each side thereof, third means for electrically contacting the intervening region, a gate region of semiconductor material of the same conductivity type as the channel region adjacent the intervening region forming a second junction with depletion regions on each side thereof, the gate region being more heavily doped than the intervening region, fourth means for electrically contacting the gate region, the gate being spaced from the channel region by the intervening region, the method comprising:

applying a variable potential between any two of the means for electrically contacting the regions, the variable potential being at least intermittently of sufficient magnitude and polarity to merge the depletion regions of the gate and the channel in the intervening region, without punch through of either depletion region to either junction, whereby the impedance of the channel between the spaced first and second means for contacting the channel is controlled by a variable potential.

8. A method of operating a junction field-effect transistor having a channel region of semiconductor material of a first conductivity type with spaced first and second means for electrically contacting the channel region so that current can flow therethrough, an intervening region of a different conductivity type material adjacent the channel region forming a first junction therewith with depletion regions on each side thereof, third means for electrically contacting the intervening region, a gate region of semiconductor material of the same conductivity type as the channel region adjacent the intervening region forming a second junction with depletion regions on each side thereof, fourth means for electrically contacting the gate region, the gate being spaced from the channel region by the intervening region, and at least one semiconductor region of the same conductivity type as the source, drain and gate electrode connected to the source, drain or gate electrode to form a semiconductor interconnect, the method comprising:

applying a variable potential between any two of the means for electrically contacting the regions, the variable potential being at least intermittently of sufficient magnitude and polarity to merge the depletion regions of the gate and the channel in the intervening region, without punch through of either depletion region to either junction, whereby the impedance of the channel between the spaced first and second means for contacting the channel is controlled by the variable potential.

9. A method of operating a junction field-effect transistor having a channel region of semiconductor material of a first conductivity type with spaced first and second means for electrically contacting the channel region so that current can flow therethrough, an intervening region of a different conductivity type material adjacent the channel region forming a first junction therewith with depletion regions on each side thereof, third means for electrically contacting the intervening region, a gate region of semiconductor material of the same conductivity type as the channel region adjacent the intervening region forming a second junction with depletion regions on each side thereof, the gate region being embedded in the device and spaced from the channel region by the intervening region and surrounded on all sides by semiconductor material of the same conductivity type material as the intervening region, fourth means for electrically contacting the gate region, the method comprising:

applying a variable potential between any two of the means for electrically contacting the regions, the variable potential being at least intermittently of sufficient magnitude and polarity to merge the depletion regions of the gate and the channel in the intervening region, without punch through of either depletion region to either junction, whereby the impedance of the channel between the spaced first and second means for contacting the channel is controlled by the variable potential.

10. A method of operating a junction field-effect transistor having a channel region of semiconductor material of a first conductivity type with spaced first and second means for electrically contacting the channel region so that current can flow therethrough, the channel orientation with respect to current flow through the channel being perpendicular to the surface of the device, an intervening region of a different conductivity type material adjacent the channel region forming a first junction therewith with depletion regions on each side thereof, third means for electrically contacting the intervening region, a gate region of semiconductor material of the same conductivity type as the channel region adjacent the intervening region forming a second junction with depletion regions on each side thereof, fourth means for electrically contacting the gate region, the gate being spaced from the channel region by the intervening region, the method comprising:

applying a variable potential between any two of the means for electrically contacting the regions, the variable potential being at least intermittently of sufficient magnitude and polarity to merge the depletion regions of the gate and the channel in the intervening region, without punch through of either depletion region to either junction, whereby the impedance of the channel between the spaced first and second means for contacting the channel is controlled by the variable potential.

11. The junction field-effect device of any of claims 1-5 wherein the channel region and source, drain and gate electrode regions of a first conductivity type are N-type semiconductor material and wherein the intervening layer of semiconductor material of a different conductivity type is P-type semiconductor material.

12. The junction field-effect device of any of claims 1-5 wherein the channel region and source, drain and gate electrode regions of a first conductivity type are P-type semiconductor material and wherein the intervening layer of semiconductor material of a different conductivity type is N-type semiconductor material.

13. The junction field-effect device of any of claims 1-5 wherein the semiconductor material of the gate and channel regions at any cross section of the device perpendicular to the channel is doped with substantially the same amount of impurity concentration.

14. The junction field-effect device of any of claims 1-5 wherein the channel orientation with respect to the current flow through the channel is parallel to the surface of the device.

15. The junction field-effect device of any of claims 1-5 wherein the gate electrode region is surrounded with conductivity type material of the different conductivity type so that at least a portion of the gate electrode is embedded in the intervening layer under the channel and is isolated from the region of different conductivity type by the depletion region which forms around it.

16. The junction field-effect transistor of claim 14 wherein the gate, source and drain electrodes are diffused into the surface of the device and wherein the channel interconnects the drain and source below the surface of the device, the channel being separated from the gate by the intervening layer.

17. The junction field-effect device of claim 14 wherein the gate region is imbedded in the device below the intervening layer and spaced from the channel by the intervening layer and surrounded on all sides by semiconductor material of the same conductivity type as the intervening layer and wherein the device further comprises a surface contact semiconductor region of the same conductivity type material as the gate extending from the surface of the device to level of the gate spaced from the gate and the channel by the intervening layer region of semiconductor material and a semiconductor interconnect of the same conductivity type material as the gate connecting the gate electrode region to the surface contact semiconductor region.

18. The junction field-effect device of any of claims 1-5 wherein at least one semiconductor region of the same conductivity type material as the gate electrode is connected to the gate electrode to form a semiconductor interconnect.

19. The junction field-effect device of claim 18 wherein the device further comprises a surface contact region of the same conductivity type material as the gate electrode region extending from the surface of the device to the level of the gate separated from the gate and the channel by an intervening layer of a different conductivity type material and wherein the semiconductor interconnect extends from and connects the gate to the surface contact region.

20. The junction field-effect device of claim 18 in an integrated circuit having at least one additional semiconductor region of the same conductivity type material as the gate electrode region separated from the gate and channel by an intervening layer of semiconductor material of a different conductivity type and wherein the semiconductor interconnect extends from and connects the gate to the additional semiconductor region of the same conductivity type material.

21. The junction field-effect device of any of claims 1-5 wherein at least one additional region of semiconductor material of the same conductivity type as the source electrode is connected to the source electrode to form a semiconductor interconnect.

22. The junction field-effect device of claim 21 wherein the device further comprises a surface contact region of the same conductivity type material as the source electrode region extending from the surface of the device to the level of the source electrode separated from the gate and the channel by an intervening layer of a different conductivity type material and wherein the semiconductor interconnect extends from and connects the source electrode to the surface contact region.

23. The junction field-effect device of claim 21 in an integrated circuit having at least one additional semiconductor region of the same conductivity type material as the source electrode region separated from the gate and channel by an intervening layer of semiconductor material of a different conductivity type and wherein the semiconductor interconnect extends from and connects the source electrode to the additional semiconductor region of the same conductivity type material.

24. The junction field-effect device of any of claims 1-5 wherein at least one additional region of semiconductor material of the same conductivity type as the drain electrode is connected to the drain electrode to form a semiconductor interconnect.

25. The junction field-effect device of claim 24 wherein the device further comprises a surface contact region of the same conductivity type material as the drain electrode region extending from the surface of the device to the level of the drain electrode separated from the gate and the channel by an intervening layer of a different conductivity type material and wherein the semiconductor interconnect extends from and connects the drain electrode to the surface contact region.

26. The junction field-effect device of claim 24 in an integrated circuit having at least one additional semiconductor region of the same conductivity type material as the drain electrode region separated from the gate and channel by an intervening layer of semiconductor material of a different conductivity type and wherein the semiconductor interconnect extends from and connects the drain electrode to the additional semiconductor region of the same conductivity type material.

27. The semiconductor device of claim 5 wherein the regions of semiconductor material of different conductivity types are created by predeposition of impurity concentrations which are diffused into the semiconductor material so that each semiconductor region is more lightly doped near the center of each region and more heavily doped toward the surfaces of each region.

28. The junction field-effect device of claim 5 wherein the impurity concentration of the intervening layer is produced by diffusion and wherein the intervening layer has a diffusion profile and wherein the center of the intervening layer is more lightly doped with impurity concentration than those portions of the intervening layer away from the center of the intervening layer.

29. The junction field-effect device of claim 5 wherein impurity concentration of the channel is produced by diffusion and wherein the channel has a diffusion profile and wherein the center of the channel is more lightly doped with impurity concentration than those portions away from the center of the channel.

30. The junction field-effect device of claim 5 wherein the impurity concentration of the gate is produced by diffusion and wherein the gate has a diffusion profile wherein the center of the gate is more lightly doped with impurity concentration than those portions away from the center of the gate.

31. The junction field-effect device of any of claims 1-5 wherein the device comprises a plurality of gate electrode regions each gate region being of the same conductivity type material as the channel and being spaced from the channel region by an intervening region of semiconductor material of a different conductivity type.

32. The junction field-effect device of any of claims 1-5 further comprising a second gate electrode region of the same conductivity type material as the channel region spaced from the channel by the intervening layer on the opposite side of the channel region from the first gate electrode.

33. The junction field-effect device of claim 32 further comprising means for applying a control voltage to either gate region so that when a control voltage is applied to either gate region the channel is opened whereby the junction field-effect device performs an OR function.

34. The junction field-effect device of claim 32 further comprising means for applying a control voltage to both gate electrode regions wherein the control voltage is applied simultaneously to both gate electrode regions so that each gate depletion region merges with the channel depletion region in the intervening layer on opposite sides of the channel thereby causing the channel depletion region in the channel to pinch off current flow or to open the channel to current flow from both sides of the channel.

35. The junction field-effect device of any of claims 1-5 further comprising a second gate electrode region of the same conductivity type material as the channel region spaced from the channel by the intervening layer of a different conductivity type said second gate region being positioned at right angles to the first gate electrode region and further comprising means for applying a control voltage to each gate so that both gates function to open the channel and so that a control voltage must be applied to both gates to open the channel whereby the junction field-effect device performs an AND function.

36. A semiconductor device including a body of semiconductor material of a first conductivity type having a channel region of a second conductivity type semiconductor material embedded therein formed a first junction with the body of semiconductor material said channel region having a source electrode on one end thereof and a drain electrode on the other end thereof and means electrically connected to said electrodes to cause current flow therethrough, both source and drain electrode being of the same conductivity type semiconductor material as the channel region, said semiconductor device further comprising a gate electrode of the same conductivity type material as the channel region embedded in the body of semiconductor material and separated from the channel by a layer of the semiconductor material of the first conductivity type said gate electrode forming a second junction with said body of semiconductor material, said gate region being of a dimension which at least spans the length of the channel and spans at least a portion of the width of the channel, means for reverse biasing said junctions to form depletion regions associated with each junction and means for applying a variable voltage across said second junction so that depletion region associated with said second junction merges with the depletion region associated with said first junction in said intervening layer to cause changes to the depletion region in the channel so that current flow through the channel is controlled by the variable voltage applied across said second junction; and wherein the body of semiconductor material is constructed from a substrate of first conductivity type material upon which is grown an epitaxial layer of the same conductivity type material and wherein said channel region, said source electrode, said drain electrode and said gate are formed by predeposition of impurities on said substrate and on the surface of said epitaxial layer, said impurities being diffused into the body of semiconductor material with a drive in diffusion so that said gate region and said channel region have a vertical orientation relative to the surface of the device.

37. The semiconductor device of claim 36 wherein at least one region of semiconductor material of the second conductivity type is diffused into the substrate prior to predeposition of impurities on the surface of the substrate, said region diffused into the substrate comprising one of the means for electrically contacting the gate, source or drain electrode.

38. The semiconductor device of claim 37 wherein an additional region of semiconductor material of the second conductivity type is diffused through the epitaxial layer at an area separated from the channel region and the gate electrode to contact the region of semiconductor material diffused in the substrate said additional region comprising part of the means for electrically contacting said drain or source electrode by bringing the electrode connection to the surface with semiconductor material of the second conductivity type.

39. The method of any of claims 6-10 wherein the step of applying a variable potential between any two of the means for electrically contacting the regions comprises the step of applying a variable potential between the fourth means for electrically contacting the gate region and any one of the first, second or third means.

40. The method of any of claims 6-10 wherein the step of applying a variable potential between any two of the means for electrically contacting the regions comprises the step of applying the variable potential between either one of the first and second means and any one of the other means for electrically contacting the regions.

41. The method of any of claims 6-10 wherein the step of applying a variable potential between any two of the means for electrically contacting the regions comprises the step of applying the variable potential between the third means for electrically contacting the intervening region and any one of the first, second or fourth means.

42. The method of any of claims 6-10 wherein the method further comprises the step of:
applying a potential difference across both junctions sufficient to reverse bias each junction.

43. The method of any of claims 6-10 wherein the method further comprises:
applying a potential difference across each junction sufficient to reverse bias each junction.

44. The method of claim 42 wherein the step of applying a potential difference to reverse bias the junctions comprises applying a sufficient potential difference across each junction so that the depletion regions associated with each junction merge in the intervening region and wherein the step of applying a variable potential comprises applying a sufficient variable potential to vary the impedence of the channel between the first and second means.

45. The method of claim 44 wherein the step of applying a potential difference to reverse bais each junction comprises the step of applying a sufficient potential difference so that each junction is reversed biased but the depletion regions associated with each junction are not merged in the intervening region and wherein the step of applying a variable potential comprises the step of applying a sufficient variable potential to cause the depletion regions in the intervening region to merge and to vary the impedence of the channel between the first and second means for contacting the channel.

46. A method of manufacturing a junction field-effect device controlled by merged depletion regions in an intervening layer between gate and channel comprising the steps of:
providing a semiconductor substrate of a first conductivity type;
diffusing into the substrate at least one semiconductor interconnect of a second conductivity type;
applying a dopant of the second conductivity type to selected areas of the surface of the semiconductor substrate to form a gate region of second conductivity type and a channel region of second conductivity type, one of said areas being over the semiconductor interconnect, and said areas being spaced one from the other;

growing an epitaxial layer of the first conductivity type on the substrate;
applying a dopant of the second conductivity type to selected areas of the surface of the epitaxial layer in alignment with the predeposition of dopant of the second conductivity type applied to the surface of the substrate; and
performing a drive in diffusion so that the predeposition of impurities causes a gate region and channel region of the second conductivity type to form in the epitaxial layer each being more lightly doped toward the center of the layer and more heavily doped toward the outer surfaces of the layer.

47. The method of claim 46 wherein the method further comprises:
applying a dopant of the first conductivity type to the surface of the substrate to the intervening area between the gate and channel and all other areas of the substrate surrounding the gate and channel before growing the epitaxial layer;
applying a dopant of the first conductivity type to the surface of the epitaxial layer in alignment with the predeposition of dopant of the first conductivity type applied to the substrate before the drive in diffusion step; and
wherein the drive in diffusion step causes an intervening region of the first conductivity type to be formed between the gate and channel which is more lightly doped toward the center of the epitaxial layer and more heavily doped toward the outer surfaces of the epitaxial layer.

48. The method of claim 46 wherein the method comprises:
diffusing into the semiconductor substrate of a first conductivity type a plurality of semiconductor interconnects of a second conductivity type.

49. The method of claim 46 wherein the method further comprises:
diffusing into the surface of the epitaxial layer over one of said gate or channel areas at least one semiconductor interconnect of a second conductivity type material.

50. The method of claim 49 wherein the method comprises:
diffusing into the surface of the epitaxial layer a plurality of semiconductor interconnects of a second conductivity type material.

51. The method of claim 43 wherein the step of applying a potential difference to reverse bias the junctions comprises applying a sufficient potential difference across each junction so that the depletion regions associated with each junction merge in the intervening region and wherein the step fo applying a variable potential comprises applying a sufficient variable potential to vary the impedence of the channel between the first and second means.

52. The method of claim 43 wherein the step of applying a potential difference to reverse bias each junction comprises the step of applying a sufficient potential difference so that each junction is reversed biased but the depletion regions associated with each junction are not merged in the intervening region and wherein the step of applying a variable potential comprises the step of applying a sufficient variable potential to cause the depletion regions in the intervening region to merge and to vary the impedence of the channel between the first and second means for contacting the channel.

* * * * *